(12) United States Patent
Han et al.

(10) Patent No.: US 11,049,828 B2
(45) Date of Patent: Jun. 29, 2021

(54) ELECTRONIC DEVICE WITH INTERCONNECTION STRUCTURE OBLATE ELLIPSOID-SHAPED APERTURE

(71) Applicant: Amkor Technology Singapore Holding Pte. Ltd., Singapore (SG)

(72) Inventors: Gyu Wan Han, Seoul (KR); Jin Seong Kim, Goyang-si (KR); Byong Woo Cho, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 105 days.

(21) Appl. No.: 15/078,474

(22) Filed: Mar. 23, 2016

(65) Prior Publication Data
US 2016/0284657 A1  Sep. 29, 2016

(30) Foreign Application Priority Data
Mar. 24, 2015  (KR) ........................ 10-2015-0040717

(51) Int. Cl.
| | |
|---|---|
| *H01L 23/00* | (2006.01) |
| *H01L 23/31* | (2006.01) |
| *H01L 21/56* | (2006.01) |

(52) U.S. Cl.
CPC .............. *H01L 24/13* (2013.01); *H01L 21/56* (2013.01); *H01L 23/3121* (2013.01); *H01L 23/3157* (2013.01); *H01L 24/03* (2013.01); *H01L 24/05* (2013.01); *H01L 24/11* (2013.01); *H01L 24/17* (2013.01); *H01L 24/16* (2013.01);
(Continued)

(58) Field of Classification Search
CPC ..... H01L 2924/181; H01L 2224/73204; H01L 2924/014; H01L 23/49816; H01L 23/3128; H01L 2224/0401; H01L 2224/81815; H01L 23/49838; H01L 2224/97; H01L 24/17;
(Continued)

(56) References Cited

U.S. PATENT DOCUMENTS

| | | | |
|---|---|---|---|
| 5,608,265 A * | 3/1997 | Kitano | ............... H01L 23/3107 257/738 |
| 2007/0092996 A1 | 4/2007 | Lo et al. | |

(Continued)

FOREIGN PATENT DOCUMENTS

| | | |
|---|---|---|
| KR | 10-2009-0122771 | 12/2009 |
| KR | 10-2010-0113676 | 10/2010 |

(Continued)

OTHER PUBLICATIONS

Korean Notice of Allowance dated Aug. 23, 2017 for Korean Patent Application No. 10-2015-0040717.

*Primary Examiner* — Wael M Fahmy
*Assistant Examiner* — Quinton A Brasfield
(74) *Attorney, Agent, or Firm* — McAndrews, Held & Malloy, Ltd.

(57) ABSTRACT

An electronic device and a method of making an electronic device. As non-limiting examples, various aspects of this disclosure provide various methods of making electronic devices, and electronic devices manufactured thereby, that comprise utilizing a compressed interconnection structure (e.g., a compressed solder ball, etc.) in an encapsulating process to form an aperture in an encapsulant. The compressed interconnection structure may then be reformed in the aperture.

15 Claims, 14 Drawing Sheets

(52) U.S. Cl.
CPC ............... *H01L 2224/0239* (2013.01); *H01L 2224/02381* (2013.01); *H01L 2224/03452* (2013.01); *H01L 2224/03462* (2013.01); *H01L 2224/03464* (2013.01); *H01L 2224/0401* (2013.01); *H01L 2224/05008* (2013.01); *H01L 2224/0516* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05569* (2013.01); *H01L 2224/05624* (2013.01); *H01L 2224/05639* (2013.01); *H01L 2224/05644* (2013.01); *H01L 2224/05647* (2013.01); *H01L 2224/05664* (2013.01); *H01L 2224/11849* (2013.01); *H01L 2224/13006* (2013.01); *H01L 2224/13021* (2013.01); *H01L 2224/13023* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/16237* (2013.01); *H01L 2924/15192* (2013.01); *H01L 2924/15321* (2013.01); *H01L 2924/18161* (2013.01)

(58) Field of Classification Search
CPC ... H01L 2924/15311; H01L 2225/1058; H01L 21/56
USPC ......................................................... 257/738
See application file for complete search history.

(56) References Cited

U.S. PATENT DOCUMENTS

| | | | | |
|---|---|---|---|---|
| 2009/0283900 | A1* | 11/2009 | Yamada | ................. H01L 21/565 |
| | | | | 257/698 |
| 2009/0289359 | A1* | 11/2009 | Jang | ..................... H01L 21/4846 |
| | | | | 257/737 |
| 2015/0021764 | A1 | 1/2015 | Paek et al. | |
| 2016/0197032 | A1 | 7/2016 | Paek et al. | |

FOREIGN PATENT DOCUMENTS

| | | |
|---|---|---|
| KR | 10-2013-0008666 A | 1/2013 |
| KR | 101411810 B1 | 4/2014 |
| KR | 10-2015-0010896 | 1/2015 |

* cited by examiner

ELECTRONIC DEVICE WITH INTERCONNECTION STRUCTURE OBLATE ELLIPSOID-SHAPED APERTURE

CROSS-REFERENCE TO RELATED APPLICATIONS/INCORPORATION BY REFERENCE

The present application makes reference to, claims priority to, and claims the benefit of Korean Patent Application No. 10-2015-0040717, filed on Mar. 24, 2015, in the Korean Intellectual Property Office and titled "SEMICONDUCTOR DEVICE AND MANUFACTURING METHOD THEREOF," the contents of which are hereby incorporated herein by reference in their entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
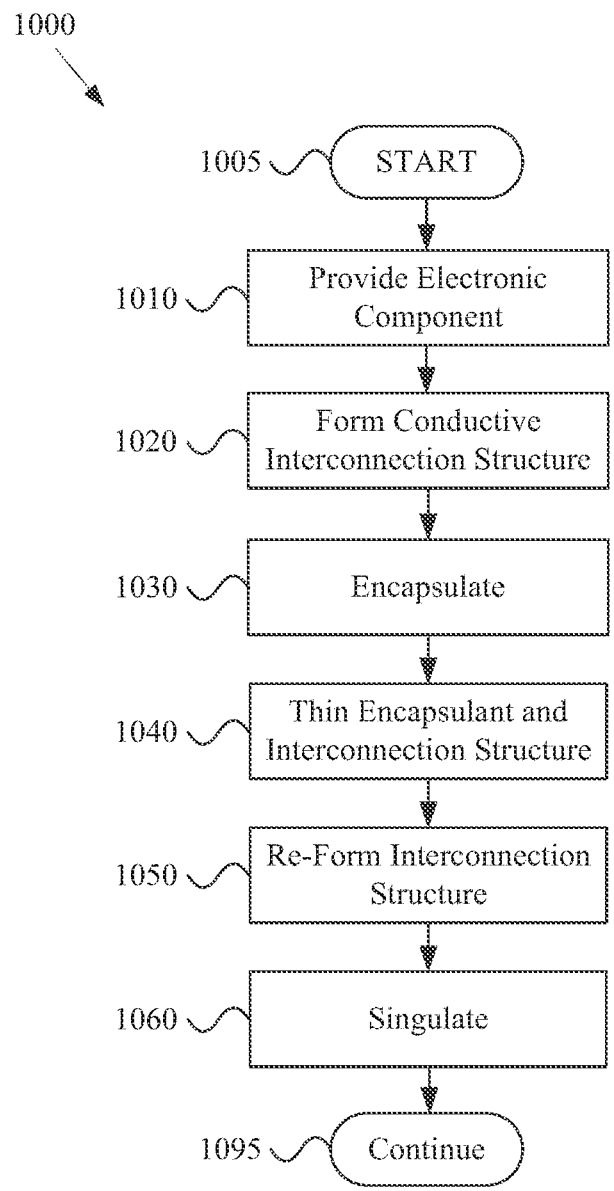
FIG. 1 shows a flow diagram of an example method of making an electronic device, in accordance with various aspects of the present disclosure.

Various aspects of this disclosure provide an electronic device and a method of making an electronic device. As non-limiting examples, various aspects of this disclosure provide various methods of making electronic devices, and electronic devices manufactured thereby, that comprise utilizing a compressed interconnection structure (e.g., a compressed solder ball, etc.) in an encapsulating process to form an aperture in an encapsulant. The compressed interconnection structure may then be reformed in the aperture.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Various aspects of the present disclosure provide an electronic device (e.g., a semiconductor device) that has a reduced thickness, and a manufacturing method thereof characterized by a reduced processing time and a reduced processing cost.

Various aspects of the present disclosure provide an electronic device (e.g., a semiconductor device) comprising a protruding interconnection structure (e.g., a proud ball structure) that may be implemented without an encapsulant ablation process and/or without an additional ball drop process.

Various aspects of the present disclosure provide an electronic device (e.g., a semiconductor device) comprising a semiconductor die, a conductive ball electrically connected to the semiconductor die, and an encapsulant covering the semiconductor die and the conductive ball, wherein the encapsulant has a interior (or inner) surface spaced apart from the conductive ball.

Various aspects of the present disclosure also provide an electronic device (e.g., a semiconductor device) comprising a substrate (e.g., a circuit board) having a circuit pattern, a semiconductor die electrically connected to the circuit pattern, a conductive ball electrically connected to the circuit pattern, and an encapsulant covering the circuit board, the semiconductor die and conductive ball, wherein the encapsulant has a separating surface spaced apart from the conductive ball.

Various aspects of the present disclosure additionally provide a method of manufacturing a semiconductor device, the manufacturing method comprising attaching a first spherical conductive ball to an electronic component (e.g., a semiconductor die, substrate, etc.), compressing the first spherical conductive ball to form an conductive ball having an oblate ellipsoid shape and encapsulating the oblate ellipsoid-shaped conductive ball using an encapsulant, grinding and removing portions of the oblate ellipsoid-shaped conductive ball and the encapsulant, and re-balling the grinded oblate ellipsoid-shaped conductive ball to form a second spherical conductive ball (e.g., smaller than the first spherical conductive ball).

Various aspects of the present disclosure provide an electronic device, and a method of manufacturing thereof, where the electronic device comprises: an electronic component comprising a conductive pad; an encapsulating material on the electronic component; an aperture through the encapsulating material that exposes the conductive pad, the aperture defined by an inner surface of the encapsulating material and shaped like a portion of an oblate ellipsoid; and a conductive interconnection structure that extends completely through the aperture and protrudes from the encapsulating material, is electrically connected to the conductive pad, and is separated from at least a portion of the inner surface of the encapsulating material.

Various aspects of the present disclosure also provide an electronic device, and a method of manufacturing thereof, where the electronic device comprises: an electronic component comprising a conductive pad; an encapsulating material on the electronic component, wherein the encapsulating material has a top surface and a bottom surface, opposite the top surface, that faces the electronic component; an aperture through the encapsulating material that exposes the conductive pad, wherein the aperture is defined by an inner surface of the encapsulating material that has a continually changing upward slope; and a conductive interconnection structure that extends completely through the aperture and protrudes from the top surface of the encapsulating material, is electrically connected to the conductive pad, and is separated from at least a portion of the inner surface of the encapsulating material.

Various aspects of the present disclosure additionally provide an electronic device, and a method of manufacturing thereof, where the electronic device comprises: an electronic component comprising a conductive pad; an encapsulating material on the electronic component, wherein the encapsulating material has a top surface and a bottom surface, opposite the top surface, that faces the electronic component; an aperture through the encapsulating material that exposes the conductive pad, wherein the aperture is defined by an inner surface of the encapsulating material; and a conductive interconnection structure that extends completely through the aperture and protrudes from the top surface of the encapsulating material, is electrically connected to the conductive pad, and is separated from at least a portion of the inner surface of the encapsulating material by a gap, wherein the gap between inner surface of the encapsulating material and the conductive interconnection structure continually increases between a bottom end of the aperture and a point of maximum width of the aperture The above and other aspects of the present disclosure will be described in or be apparent from the following description of various example implementations. Various aspects of the present disclosure will now be presented with reference to accompanying drawings.

FIG. 1 shows a flow diagram of an example method 1000 of making an electronic device, in accordance with various aspects of the present disclosure. The example method 1000 may, for example, share any or all characteristics with any other method discussed herein (e.g., the example method 4000 of FIG. 4, the example method 6000 of FIG. 6, etc.). FIGS. 2A-2E show cross-sectional views illustrating example electronic devices and example methods of making an electronic device, in accordance with various aspects of the present disclosure. The structures shown in 2A-2E may share any or all characteristics with analogous structures shown in FIGS. 3A-3B, FIGS. 5A-5F, FIGS. 7A-7G, etc. FIGS. 2A-2E may, for example, illustrate an example electronic device at various stages (or blocks) of the example method 1000 of FIG. 1. FIGS. 1 and 2A-2E will now be discussed together. It should be noted that the order of the example blocks of the example method 1000 may vary without departing from the scope of this disclosure.

The example method 1000 may, at block 1010, comprise providing an electronic component for processing. Block 1010 may comprise providing the electronic component in any of a variety of manners, non-limiting examples of which are provided herein.

Block 1010 may, for example, comprise receiving the electronic component (or plurality thereof, or panel thereof, or wafer thereof, etc.) from an upstream manufacturing station or process (e.g., testing process, cleaning process, marking or tracking process, etc.), receiving the electronic component from an offsite location (e.g., an offsite electronic component production facility, warehouse, etc.), etc. Block 1010 may then, for example, comprise providing such received electronic component for further processing. Also for example, block 1010 may comprise forming any or all of the various aspects of the electronic component.

The electronic component may comprise any of a variety of characteristics. For example, the electronic component may comprise an active component (e.g., a semiconductor transistor, semiconductor integrated circuit, various diodes, optoelectronic devices, power sources, etc.), a passive component (e.g., a resistor, capacitor, inductor, various sensors or transducers, etc.), an electromechanical component, combinations thereof, equivalents thereof, etc. In various example implementations, the electronic component may also comprise an interposer or substrate or signal distribution structure, for example an interposer or substrate or signal distribution structure with only signal routing and connecting structures (e.g., with no active or passive components), or with embedded active and/or passive components.

The electronic component may, for example, comprise a semiconductor die. The semiconductor die may, for example, be or comprise silicon or other semiconductor material with one or more circuit elements formed therein. For example, the semiconductor die may comprise logic circuitry (e.g., discrete logic circuitry, processor circuitry, application specific integrated circuitry, programmable logic circuitry, etc.), memory circuitry (e.g., random access memory, read only memory, EEPROM circuitry, flash memory circuitry, memory stick memory, etc.), analog circuitry, digital and/or analog power supply circuitry, hybrid analog/digital circuitry, etc. Though various examples provided herein are presented in the context of a semiconductor die electronic component, the scope of this disclosure is not limited thereto.

A semiconductor die (or other component) provided at block 1010 may, for example, comprise a conductive pad (e.g., bond pad, land, trace, etc.). The semiconductor die may also comprise a die dielectric layer, which may for example comprise an aperture (or opening) extending through the die dielectric layer that exposes the conductive pad through the die dielectric layer.

The conductive pad may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. The conductive pad may, for example, be utilized for inputting and/or outputting electrical signals to and/or from the semiconductor die (or other component).

In an example implementation in which block 1010 comprises forming the conductive pad, the conductive pad may be formed or deposited utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto.

The die dielectric layer may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. Note that the die dielectric layer may also be referred to as a passivation layer, a protective layer, etc.

In an example implementation in which block 1010 comprises forming the die dielectric layer, the die dielectric layer may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto. Note that the die dielectric layer may be or comprise a native dielectric material (e.g., a native oxide layer, etc.) not explicitly formed by a manufacturing process.

A signal distribution structure may be on the semiconductor die. The signal distribution structure may also be referred to as a redistribution layer (RDL), interposer, substrate, coreless substrate, etc. The signal distribution structure may comprise one or more dielectric layers, one or more conductive layers, under bump metallization (UBM), etc.

For example, a first dielectric layer may be on the semiconductor die. The first dielectric layer may also, for example, be referred to as a passivation layer.

The first dielectric layer may, for example, be on (e.g., directly or indirectly on) the die dielectric layer and/or on at least a portion of the conductive pad exposed through the aperture in the die dielectric layer. The first dielectric layer may also, for example, comprise a first aperture (or opening) through which the conductive pad is exposed. In an example implementation, the entire die dielectric layer (e.g., a top surface or top side thereof, etc.) may be covered by the first dielectric layer, a outward ring of the conductive pad may be covered by the first dielectric layer, an outermost peripheral ring of the conductive pad may be covered by the die dielectric layer and the first dielectric layer (e.g., on top of the die dielectric layer), and a center region of the conductive pad may be exposed through the aperture in the die dielectric layer and through the first aperture in the first dielectric layer.

The first dielectric layer may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto.

The first dielectric layer may, for example, comprise a different dielectric material (or type of dielectric material) than the die dielectric layer. For example, in a first example implementation, the first dielectric layer may comprise an organic dielectric material, and the die dielectric layer may comprise an inorganic dielectric material. In another example implementation, the first dielectric layer may comprise the same dielectric material as the die dielectric layer.

In an example implementation in which block 1010 comprises forming the first dielectric layer, block 1010 may comprise forming the first dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. As discussed herein, block 1010 (or generally any or all of the processes discussed herein) may be performed at the semiconductor wafer level or panel level, or at the individual die level.

Also for example, a conductive layer may be on (e.g., directly on or indirectly on) the central region of the conductive pad that is exposed by the aperture in the die dielectric layer and by the first aperture in the first dielectric layer. The conductive layer is thus electrically and mechanically coupled to the conductive pad. The conductive layer may also be referred to as a redistribution layer, a signal distribution structure, signal routing layer, etc.

The conductive layer may, for example, be formed directly on the conductive pad (e.g., with or without a seed layer) or the conductive layer may be formed on intervening metallic layers formed on the conductive pad before the conductive layer. The conductive layer may, for example, comprise a first portion formed in the first aperture in the first dielectric layer, and a second portion formed on the top surface of the first dielectric layer.

The conductive layer may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive layer may, for example, comprise the same conductive material as the conductive pad. In an example implementation, the conductive layer and the conductive pad may both comprise copper and/or may be directly bonded to each other.

In an example implementation in which block 1010 comprises forming the conductive layer, block 1010 may comprise forming (or depositing) the conductive layer utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. In an example implementation, a seed layer may be formed on the conductive pad and/or on the first dielectric layer (e.g., deposited, sputtered, etc.), a mask may be formed on the seed layer and patterned to cover areas of the seed layer that are not to be plated, the conductive layer (or portion thereof) may then be electroplated on the seed layer, and the mask and non-plated portions of the seed layer may be removed (e.g., dissolved, etched, etc.). In another example implementation, the conductive layer may be formed without a seed layer (e.g., utilizing electroless plating, etc.). As discussed herein, block 1010 (or generally any or all of the processes discussed herein) may be performed at the semiconductor wafer level or panel level, or at the individual die level.

Further for example, a second dielectric layer may be on the semiconductor die. For example, the second dielectric layer may be on (e.g., directly or indirectly on) the first dielectric layer and/or on at least a portion of the conductive layer. The second dielectric layer may also, for example, comprise a second aperture (or opening) through which the conductive layer is exposed. In an example implementation, the first aperture in the first dielectric layer may generally correspond to a first end of the conductive layer, and the second aperture in the second dielectric layer may generally correspond to a second end of the conductive layer. Such a configuration may, for example, provide for lateral distribution (or routing) of an electrical signal being transmitted through the conductive layer.

In an example implementation, the entire first dielectric layer (e.g., a top surface or side thereof) may be covered by the second dielectric layer (e.g., completely or partially covered), most of the conductive layer may be covered by the second dielectric layer, and an exposed region of the conductive layer (e.g., corresponding to a conductive pad, ball pad, land, trace, etc.) may be exposed through the second aperture in the second dielectric layer.

The second dielectric layer may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), poly-benzoxazole (PBO), bismaleimide triazine (BT), a molding material, a phenolic resin, an epoxy, etc.), but the scope of the present disclosure is not limited thereto. The second dielectric layer may, for example, be or comprise the same dielectric material as the first dielectric layer and/or the die dielectric layer. The second dielectric layer may also, for example, comprise a dielectric material that is different from the dielectric material(s) of the first dielectric layer and the die dielectric layer.

In an example implementation in which block 1010 comprises forming the second dielectric layer, block 1010 may comprise forming the second dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. As discussed herein, block 1010 (or generally any or all of the processes discussed herein) may be performed at the semiconductor wafer level or panel level, or at the individual die level.

Note that the forming of the first dielectric layer, conductive layer, and/or second dielectric layer may be repeated any number of times, for example to create a multi-layered structure (e.g., a signal distribution structure, etc.) comprising a plurality of conductive layers and/or a plurality of dielectric layers. Also note that in various example implementations such layers need not be present (or formed) at all.

In an example implementation, an under bump metallization (UBM) may be on the conductive layer exposed through the second aperture in the second dielectric layer. The UBM may, for example, also be on a portion of the second dielectric layer that surrounds the second aperture.

In an example implementation, the UBM, which may also be referred to as a UBM structure, may for example comprise a layer of titanium-tungsten (TiW), which may be referred to as a layer or seed layer. Such layer may, for example, be formed by sputtering. Also for example, the UBM structure may comprise a layer of copper (Cu) on the layer of TiW. Such layer may also, for example, be formed by sputtering. In another example implementation forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure and/or processes utilized to form the UBM structure are not limited to the examples given. For example, the UBM structure may comprise a multilayered structure of chrome/chrome-copper alloy/copper (Cr/Cr-Cu/Cu), titanium-tungsten alloy/copper (Ti—W/Cu), aluminum/nickel/copper (Al/Ni/Cu), equivalents thereof, etc. The UBM structure may also, for example, comprise aluminum, palladium, gold, silver, alloys thereof, etc.

Figure 2A:
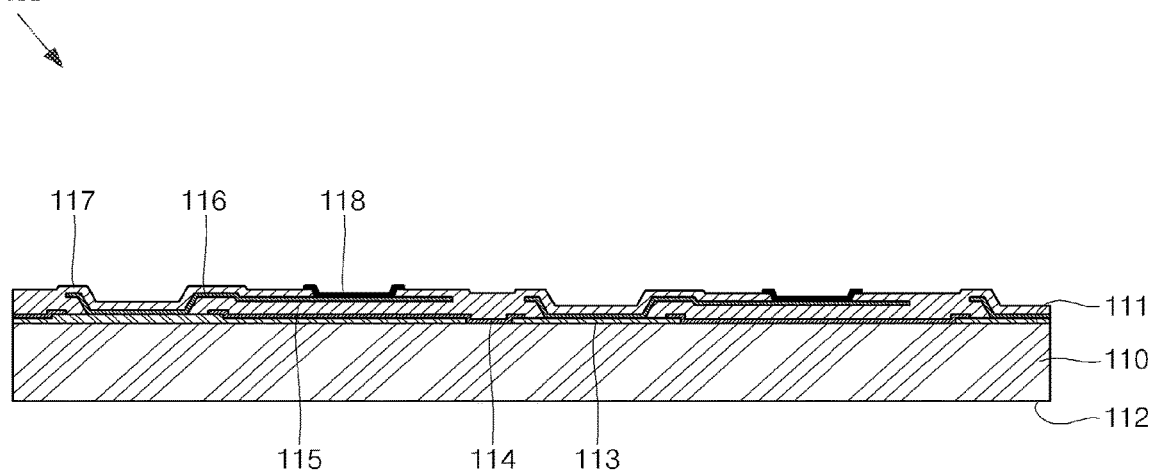
FIGS. 2A-2E show cross-sectional views illustrating example electronic devices and example methods of making an electronic device, in accordance with various aspects of the present disclosure.

An example implementation 200A showing various aspects of block 1010 is shown at FIG. 2A. The example implementation 200A (or assembly, sub-assembly, package, etc.) comprises a semiconductor die 110 having a first side 111 or surface (e.g., a top side, active side, etc.) and a second side 112 or surface (e.g., a bottom side, inactive side, etc.). The first and/or second sides may, for example, be planar. The example implementation 200A comprises a conductive pad 113 and a die dielectric layer 114, where the die dielectric layer 114 comprises an aperture through which the conductive pad 113 is exposed.

The example implementation 200A also comprises a first dielectric layer 115 on (e.g., directly on, etc.) the die dielectric layer 114 and on (e.g., directly on, etc.) an outward ring of the conductive pad 113 exposed through the die dielectric layer 114 by an aperture therein. The first dielectric layer 115 comprises a first aperture (or opening) through which a central region of the conductive pad 113 is exposed. A central region of the conductive pad 113 is exposed through the aperture in the die dielectric layer 114 and through the first aperture in the first dielectric layer 115, an outward ring of the conductive pad 113 is exposed through the aperture in the die dielectric layer 114 but is covered by the first dielectric layer 115, and an outermost peripheral ring of the conductive pad 113 is covered by both the die dielectric layer 114 and the first dielectric layer 115. Note that the so-called example rings need not be circular. For example, the outward ring and outermost peripheral ring may be square-shaped, rectangular-shaped, oval or elliptical-shaped, polygon-shaped, etc.

The example implementation 200A additionally comprises a conductive layer 116 on (e.g., directly on) the first dielectric layer 115 and on a central region of the conductive pad 113 exposed through the first aperture in the first dielectric layer 115 and the aperture in the die dielectric layer 114. In the example implementation 200A, the conductive layer 116 does not directly contact the outward ring of the conductive pad 113, which is covered by the first dielectric layer 115, and does not directly contact the outermost peripheral ring of the conductive pad 113, which is covered by both the die dielectric layer 114 and the first dielectric layer 115.

The example implementation 200A further comprises a second dielectric layer 117 on (e.g., directly on) the first dielectric layer 115 and on (e.g., directly on) most of the conductive layer 116. The second dielectric layer 117 comprises a second aperture (or opening) through which an exposed region of the conductive layer 116 (e.g., corresponding to a conductive pad, ball pad, land, trace, etc.) is exposed.

The example implementation 200A also comprises a UBM structure 118 on the exposed region of the conductive layer 116. The example UBM structure 118 is also on side surfaces of the second dielectric layer 117 bounding the second aperture and on a portion of the top surface of the second dielectric layer 117 around the second aperture.

Though the examples presented herein mainly concern a single semiconductor die, the scope of this disclosure is not limited to a single component. For example, the semiconductor die may (e.g., throughout any or all of the process blocks discussed herein) be in a wafer or panel form. Such a wafer or panel may comprise same components or different components.

Additionally, though the examples presented herein mainly focus on a single connection or terminal of an electronic component, the scope of the present disclosure is not limited thereto. For example, the aspects discussed herein readily extend to any number of connections or terminals of an electronic component (or a plurality thereof).

In general, block 1010 comprises providing an electronic component for processing. Accordingly, the scope of this disclosure should not be limited by characteristics of any particular type of electronic component or by any particular manner of providing an electronic component.

The example method 1000 may, at block 1020, comprise forming a conductive interconnection structure. Block 1020 may comprise forming (and/or coupling) a conductive interconnection structure in any of a variety of manners, non-limiting examples of which are provided herein.

Block 1020 may, for example, comprise electrically and/or mechanically coupling the interconnection structure to the conductive pad and/or UBM of the semiconductor die (or other electronic component). Block 1020 may, for example, comprise forming the interconnection structures directly on the conductive pads and/or UBM (if present). Also for example, block 1020 may comprise electrically and/or mechanically coupling the interconnection structure to a conductive layer (e.g., a signal distribution structure) that is connected to the conductive pad and/or UBM (if present). Though various examples provided herein generally focus on a single conductive interconnection structure, the scope of this disclosure is not limited thereto.

The conductive interconnection structure may comprise any of a variety of characteristics. For example, the interconnection structure may comprise a conductive ball or bump (e.g., a solder ball or bump, wafer bump, etc.). For example, in an example implementation including a solder ball or bump, such ball or bump may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosures is not limited thereto.

Block 1020 may comprise forming or attaching (or forming) the interconnection structure by ball-dropping, bumping, metal-plating, printing and reflowing, pasting and reflowing, etc. For example, block 1020 may comprise dropping a conductive ball on the UBM (or conductive pad), reflowing, and cooling. As such, the conductive ball may generally be spherical (e.g., with a flattened bottom at the UBM or conductive pad/layer interface), but may be slightly flattened. For example, the spherical radius of the interconnection structure might vary by less than 5% or by less than 10%.

The conductive interconnection structure may also, for example, comprise metal posts or pillars, wires, leads, pads, etc. In an example implementation, the interconnection structures may comprise conductive posts or pillars comprising copper and/or nickel, and may comprise a solder cap (e.g., comprising tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc.).

Figure 2B:
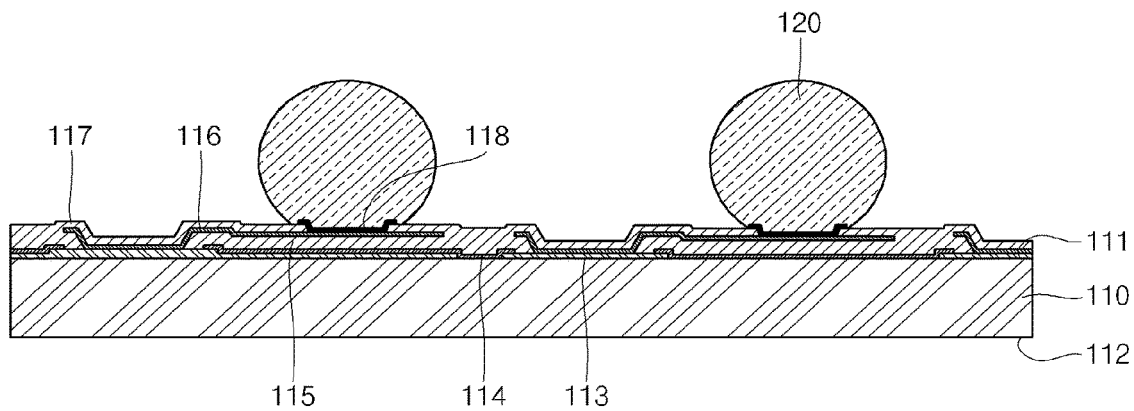

An example implementation 200B (or assembly, sub-assembly, package, etc.) of block 1020 is shown at FIG. 2B. The example implementation 200B shows an example conductive interconnection structure 120 on the UBM 118. The example conductive interconnection structure 120 is generally spherical (e.g., with a flattened bottom at the UBM 118 interface). As discussed herein, any number of such conductive interconnection structures may be formed (e.g., on an electronic component, semiconductor die, semiconductor wafer, substrate, substrate panel, etc.).

In general, block 1020 may comprise forming a conductive interconnection structure. Accordingly, the scope of various aspects of this disclosure should not be limited by characteristics of any particular interconnection structure or by any particular manner of forming or coupling an interconnection structure.

The example method 1000 may, at block 1030, comprise encapsulating the electronic component. Block 1030 may, for example, comprise performing such encapsulating in any of a variety of manners, non-limiting examples of which are provided herein.

Block 1030 may, for example, comprise forming encapsulating material to cover at least a top surface (or top side) of the electronic component, and may also cover various structures that may be on the top surface (e.g., signal distribution structures, other components, etc.). The encapsulating material may also, for example, cover at least lateral surfaces of the conductive interconnection structure (e.g., formed at block 1020). The encapsulating material may also, for example, directly contact such covered surfaces, but there may also be one or more intervening layers of material. In an example scenario in which the electronic component (e.g., a semiconductor die, substrate, etc.) is in wafer form or panel form, block 1030 may comprise covering the top side of the wafer or panel (e.g., all of the wafer or panel, at least portions of the wafer or panel that are included in completed electronic devices, etc.) with the encapsulating material.

In an example implementation, block 1030 may comprise compressing or flattening the conductive interconnection structure formed at block 1020 during the encapsulating process. For example, block 1030 may comprise utilizing a mold chase to apply a compressive (or clamping) force to the conductive interconnection structure to compress the interconnection structure. In an example scenario in which the conductive interconnection structure comprises solder, the compressive force may be high enough to compress solder. For example, in an example implementation in which the interconnection structure is generally spherical in shape, block 1030 may comprise compressing the interconnection structure into a compressed spherical shape, which may also be referred to as an oblate ellipsoid. For example, block 1030 may comprise compressing the interconnection structure to less than 90% of its original height, less than 80% of its original height, less than 75% of its original height, etc. Note that heat may also be applied during the compression process to soften the interconnection structure or make it more compliant, for example reducing the amount of compressive force needed to perform the compression.

For example, the oblate ellipsoid may comprise a first semi-principal axis (e.g., a vertical axis) and a second semi-principal axis (e.g., a horizontal axis parallel to the top side of the electronic component, etc.) that is at least 10% longer, at least 20% longer, or at least 25% longer than the first semi-principal axis. The oblate ellipsoid may, for example, comprise an ellipsoid width and an ellipsoid height that is at least 10% less, at least 20% less, or at least 25% less than the ellipsoid width. The oblate ellipsoid may, for example comprise a first portion (e.g., near the lateral extremities, etc.) that has a radius of curvature that is less than a radius of curvature of the conductive interconnection structure prior to compression (e.g., in a cross-sectional view in a vertical plane), and a second portion (e.g., near the vertical extremities, etc.) that has a radius of curvature that is greater than the radius of curvature of the conductive interconnection structure prior to compression (e.g., in a cross-sectional view cut in a vertical plane). Note that the bottom side and/or top side of the oblate ellipsoid may be generally flattened at this point (e.g., flattened at the bottom side by the UBM and/or second dielectric layer, flattened at the top side by the mold chase or other compression mechanism, etc.). Thus, in various example implementations, the top and/or bottom side of the interconnection structure may have a flat portion.

The encapsulating material may comprise any of a variety of encapsulating or molding materials (e.g., resin, polymer, polymer composite material, polymer with filler, epoxy resin with filler, epoxy acrylate with filler, combinations thereof, equivalents thereof, etc.). Block 1030 may comprise performing the encapsulating in any of a variety of manners (e.g., transfer molding, compression molding, liquid encapsulant molding, vacuum lamination, paste printing, film assisted molding, etc.). Block 1030 may, for example, comprise injecting and/or compressing the encapsulating material while the conductive interconnection structure is being compressed (e.g., by the mold chase).

Note that the interconnection structure may be compressed prior to the molding process (e.g., by a compression mechanism independent of a mold chase), for example in a manner that causes the compressed interconnection structure to remain in a compressed state once the compression pressure is released (e.g., compressed past the point at which inherent elasticity will return the interconnection structure to its original shape prior to application of the compression force). Note that such compressing may also be performed at high temperatures (e.g., approaching or exceeding reflow temperatures).

In various example implementations presented herein, the encapsulating material may have a top surface that is coplanar with the top surface of the interconnection structure. Such an example configuration may be formed during the encapsulating or after the encapsulating. For example, in an example implementation, block 1030 may refrain from forming encapsulating material on the compressed interconnection structure top surface, which may for example be covered by a mold chase, film in a film-assisted molding process, etc. In another example configuration, block 1030 may comprise forming the encapsulating material over the top surface of the compressed interconnection structure, and then performing a thinning process (e.g., grinding, chemical-mechanical planarization or polishing (CMP), etching, etc.) to planarize the top surface of the encapsulating material and/or the compressed interconnection structure surface.

Figure 2C:
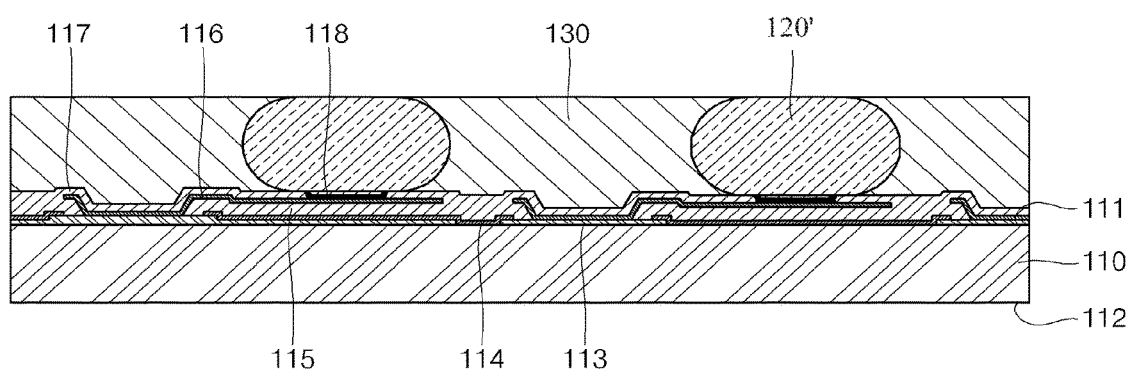

An example implementation 200C showing various aspects of block 1030 is shown at FIG. 2C. The example implementation 200C (or assembly, sub-assembly, package, etc.) comprises an encapsulating material 130. The encapsulating material 130 is shown encapsulating or covering lateral side surfaces of the compressed interconnection structure 120' (labelled item 120 in FIG. 2B prior to compression), and a top surface of the second dielectric layer 117.

In general, block 1030 may comprise encapsulating the component(s) and/or substrate(s) of block 1020. Accordingly, the scope of this disclosure should not be limited by characteristics of any particular amount of encapsulating, particular encapsulating material, and/or particular manner of performing the encapsulating.

The example method 1000 may, at block 1040, comprise thinning the assembly. For example, block 1040 may comprise thinning the encapsulating material formed at block 1030, the interconnection structure formed at block 1030, etc. Block 1040 may comprise performing the thinning in any of a variety of manners, non-limiting examples of which are provided herein.

Block 1040 may, for example, comprise performing the thinning by grinding, chemical-mechanical planarization or polishing (CMP), etching, combinations thereof, equivalents thereof, other material removal techniques, etc. Such thinning may, for example, planarize the top surface of the assembly (e.g., the top surface of the encapsulating material, the top surface of the conductive interconnection structure, etc.).

Block 1040 may, for example, comprise thinning the assembly to remove at least one fourth of the volume of the interconnection structure or at least one half the volume of the interconnection structure. In an example implementation, block 1040 may comprise removing from one fourth to one half, or one fourth to three fourths, of the volume of the interconnection structure. Note that techniques other than thinning may be utilized to remove material from the interconnection structure.

Figure 2D:
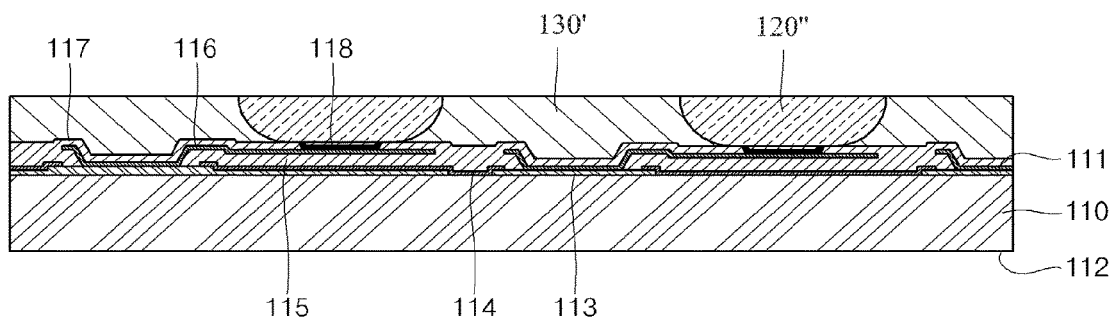

An example implementation 200D showing various aspects of block 1040 is shown at FIG. 2D. Relative to the example implementation 200C of FIG. 2C, the example implementation 200D (or assembly, sub-assembly, package, etc.) comprises a thinned encapsulating material 130' and thinned compressed interconnection structure 120". For example, a substantial portion of the volume of the encapsulating material 130 (shown in FIG. 2C) has been removed in forming the thinned encapsulating material 130', and a substantial portion of the compressed interconnection structure 120' shown in FIG. 2C has been removed in forming the thinned compressed interconnection structure 120".

In general, block 1040 may comprise thinning the assembly (or portions thereof). Accordingly, the scope of this disclosure should not be limited by characteristics of any particular amount of thinning and/or particular manner of performing the thinning.

The example method 1000 may, at block 1050, comprise re-forming the interconnection structure. Block 1050 may comprise re-forming the interconnection structure in any of a variety of manners, non-limiting examples of which are provided herein.

Block 1050 may, for example, comprise re-forming the interconnection structure formed at block 1020, compressed at block 1030, and thinned at block 1040. In an example implementation in which the interconnection structure comprises solder (e.g., a solder ball or bump, a solder-capped metal post or pillar, etc.), block 1050 may comprise reflowing the solder. For example, in an example implementation in which the interconnection structure formed at block 1020 was a solder ball or bump that was compressed at block 1030 and thinned at block 1040, block 1050 may comprise reflowing the solder ball or bump. Such reflowing may, for example, be performed by placing the assembly in a reflow oven at a temperature in a range of about 150° C. to about 250°. In such an example scenario, surface tension may cause the reflowed thinned solder ball or bump to reform into the general shape of a sphere. Since at block 1040, the example solder ball or bump loses volume, after the reforming of the solder ball at block 1050, the reformed solder ball has a smaller spherical size (or volume) than the solder ball originally formed at block 1020. Note that as with the original solder ball formed at block 1020, the re-formed (or re-balled) solder ball may generally be spherical (e.g., with a flattened bottom at the UBM or conductive pad/layer interface), but may be slightly flattened. For example, the spherical radius of the re-formed solder ball might vary by less than 5% or by less than 10%.

Additionally, since before the re-forming, the top of the thinned conductive interconnection structure was flat and coplanar with the top surface of the encapsulating material, after the re-forming of the conductive interconnection structure into a generally spherical shape, the top of the re-formed interconnection structure is higher than the top surface of the encapsulating material. Thus, the conductive interconnection structure extends (or protrudes) from the top surface of the encapsulating material.

Further, before the re-forming, an occupied volume or space of the encapsulating material was entirely filled by the compressed and thinned interconnection structure. For example, the occupied volume of the encapsulating material was the same as the volume of the compressed and thinned interconnection structure. Thus, after the re-forming, for example after the interconnection structure re-forms into a structure that extends above the encapsulating material, a portion of the previously-occupied volume of the encapsulating material is vacant. For example, a gap may exist between an interior (or inner) surface of the encapsulating material bounding (or defining) the aperture and the re-formed interconnection structure. Such a gap may, for example, extend along the entire lateral (or side) surface of the re-formed interconnection structure, but need not. For example, in an example implementation, the bottom of the interior surface (or inner surface) of the encapsulating material bounding the aperture may extend to and directly contact the second dielectric layer without contacting the re-formed interconnection structure (e.g., a portion of the second dielectric layer may extend laterally between the bottom end of the interior surface of the encapsulating material and the re-formed interconnection structure and/or UBM). Note that in other example implementations, the lower end of the interior surface (or inner surface) of the encapsulating material may contact the lower end of the re-formed interconnection structure and/or UBM.

In an example implementation, at least a portion of the interior surface of the encapsulating material bounding the aperture is laterally separated from the re-formed interconnection structure. For example, the gap may extend from a lower (or bottom) end of the aperture to the top (or upper) end of the aperture. In an example implementation, the lateral width of the gap may continually increase between a bottom end of the aperture and a point of maximum width of the aperture (e.g., where the point of maximum width may be at the top surface of the encapsulating material or may be located between the top and bottom surfaces of the encapsulating material). In another example implementation, the lateral width of the gap may first continually increase and then continually decrease between a bottom end of the aperture and a point of maximum width of the aperture (e.g., without a sharp surface discontinuity in the interior surface between the increasing portion and the decreasing portion). In another example implementation, the lateral width of the gap may first continually increase and then continually decrease between a bottom end of the aperture and top end of the aperture (e.g., without a sharp surface discontinuity in the interior surface between the increasing portion and the decreasing portion).

In another example scenario, the occupied volume or space of the encapsulating material is less than 10% or less than 20% different from the volume of the compressed and thinned interconnection structure. For example, during the thinning of block 1040, the encapsulating material and/or the interconnection structure may be thinned to different respective levels, a material other than the interconnection structure may occupy the occupied volume or space of the encapsulating material, etc. For example, the volume of the re-formed interconnection structure may be greater than the volume of the aperture in the encapsulating material (e.g., by less than 10%, by 10% to 20%, etc.), the volume of the re-formed interconnection structure may be less than the volume of the aperture in the encapsulating material (e.g., by less than 10%, by 10% to 20%, etc.), etc.

Figure 2E:
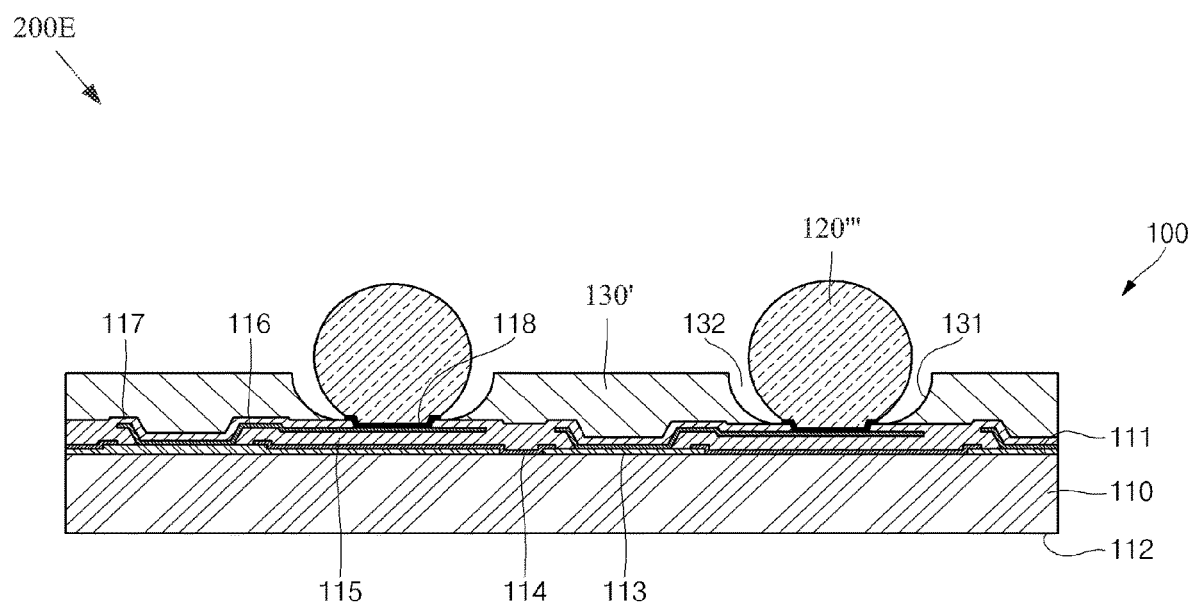

An example implementation 200E showing various aspects of block 1050 is shown at FIG. 2E. Relative to the example implementation 200B of FIG. 2B, the example implementation 200E (or assembly, sub-assembly, package, etc.) comprises a re-formed (compressed and thinned) interconnection structure 120''' that has a substantially lower volume than the original interconnection structure 120 formed at block 1020. Note that the volume of the re-formed interconnection structure 120''' may be from one fourth to three fourths of the volume of the interconnection structure 120 formed at block 1020.

The example implementation 200E shows an interior surface 131 (or inner surface) of the thinned encapsulating material 130' defining the aperture through the encapsulating material 130. The example implementation 200E also shows the gap 132 between the re-formed interconnection structure 120''' and the thinned encapsulating material 130'. Viewed from above (e.g., in a cross-sectional or planar view cut in a horizontal plane), the gap 132 may be seen as a circular region between an inner circle (or ring) corresponding to an outer lateral surface of the re-formed interconnection structure 120''', and an outer circle (or ring) corresponding to the interior surface 131 of the thinned encapsulating material 130'.

In general, block 1050 may comprise re-forming the interconnection structure. Accordingly, the scope of this disclosure should not be limited by characteristics of any particular amount of reforming and/or particular manner of performing the re-forming.

The example method 1000 may, at block 1060, comprise singulating (or excising) the electronic device from a wafer or panel of such devices. Note that block 1060 may be skipped in an example implementation in which the electronic devices are formed independently, rather than on a wafer or panel. Block 1060 may comprise performing such singulating in any of a variety of manners, non-limiting examples of which are provided herein.

Block 1060 may, for example, comprise performing wafer or panel singulation utilizing any or a variety of mechanical and/or energy-based sawing techniques (e.g., mechanical sawing (e.g., with a diamond saw blade, etc.), directed energy sawing (e.g., utilizing a laser saw, plasma saw, etc.), mechanical nibbler, etc.).

An example implementation 200E (or assembly, sub-assembly, package, etc.) showing various aspects of block 1060 is shown at FIG. 2E. The example implementation 200E shows the example electronic device 100 singulated from a wafer or panel of such devices. For example, the lateral sides of the example electronic device 100 are generally planar. For example, any one or more of the lateral sides of the semiconductor die 110, the die dielectric layer 114, the first dielectric layer 115, the conductive layer 116, the second dielectric layer 117, and/or the encapsulating material 130 may be coplanar and may be exposed to the outside of the electronic device 100.

In general, block 1060 may comprise singulating (or excising) the electronic device from a wafer or panel of such devices. Accordingly, the scope of various aspects of this disclosure should not be limited by characteristics of any particular manner of performing the singulating.

The example method 1000 may, for example at block 1095, comprise performing continued processing. Such continued processing may comprise performing any of a variety of continued processing operations. For example, block 1095 may comprise performing further encapsulating operations, forming signal distribution structures, coupling the electronic device to other electronic devices or components, testing, packaging, shipping, marking, etc. For example, block 1095 may comprise coupling the electronic device to a substrate (e.g., a circuit board, a mother board, a packaging substrate of a multi-device module, another electronic device in a 3D configuration, etc.). For example the re-formed interconnection structure may provide a mechanical and/or electrical connection between the conductive pad of the semiconductor die (or other electronic component) and circuit patterns of a substrate. Such attaching may, for example, be performed utilizing a reflow process, conductive adhesive, etc. Note that an underfill material (e.g., a capillary underfill, pre-applied underfill, molded underfill, etc.) may be formed between the electronic device and the substrate. Note that in various example implementations, since the re-formed interconnection structure protrudes from the encapsulating material, only a single interconnection structure (e.g., only a single conductive ball or bump, only a single solder ball or bump, etc.) may be needed to make the connection, thus providing for a lower vertical profile than when utilizing a double-structure (e.g., double-ball, double-bump, etc.) connection.

Block 1095 may also, for example, comprise directing execution flow of the example method 1000 to any other block (or sub-block) of the example method 1000 or any other method discussed herein.

In general, block 1095 may comprise performing continued processing. Accordingly, the scope of various aspects of this disclosure should not be limited by characteristics of any particular manner of performing continued processing.

It should be noted that although the example implementations presented in the discussion of FIGS. 1 and 2 generally include a conductive layer (or signal distribution structure) that provided a lateral displacement between the conductive pad and the exposed conductive layer and/or UBM, such a conductive layer is not necessary. For example, the UBM and/or interconnection structure may be formed directly on the conductive pad of the semiconductor die.

Figure 3A:
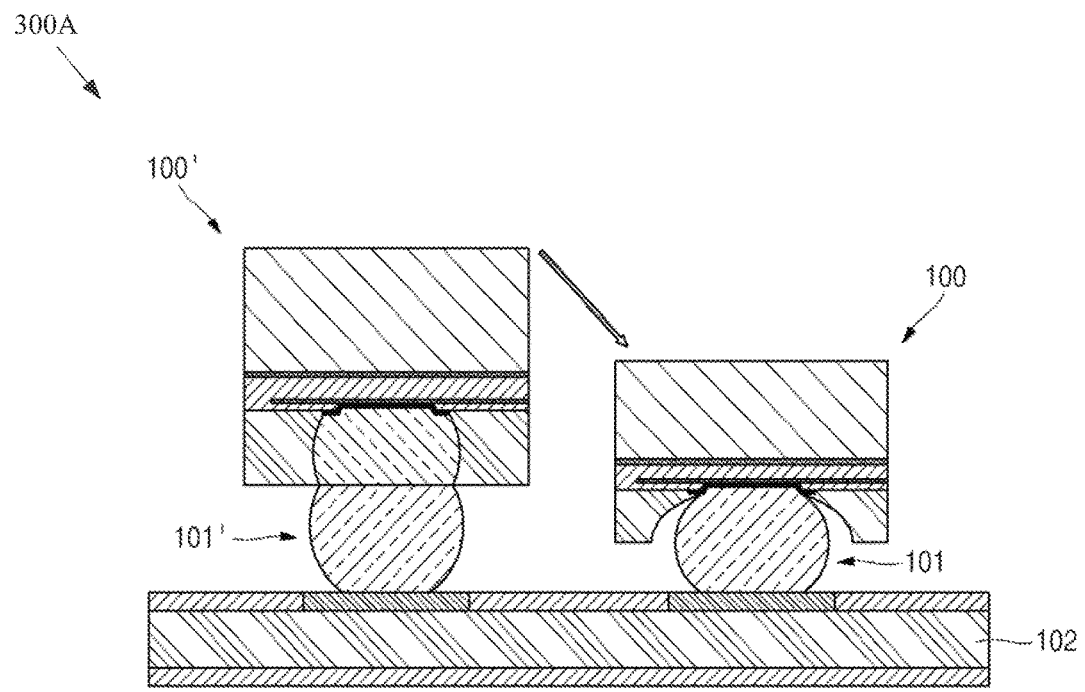
FIGS. 3A-3B show cross-sectional views illustrating example electronic devices and example methods of making an electronic device, in accordance with various aspects of the present disclosure.
Figure 3B:
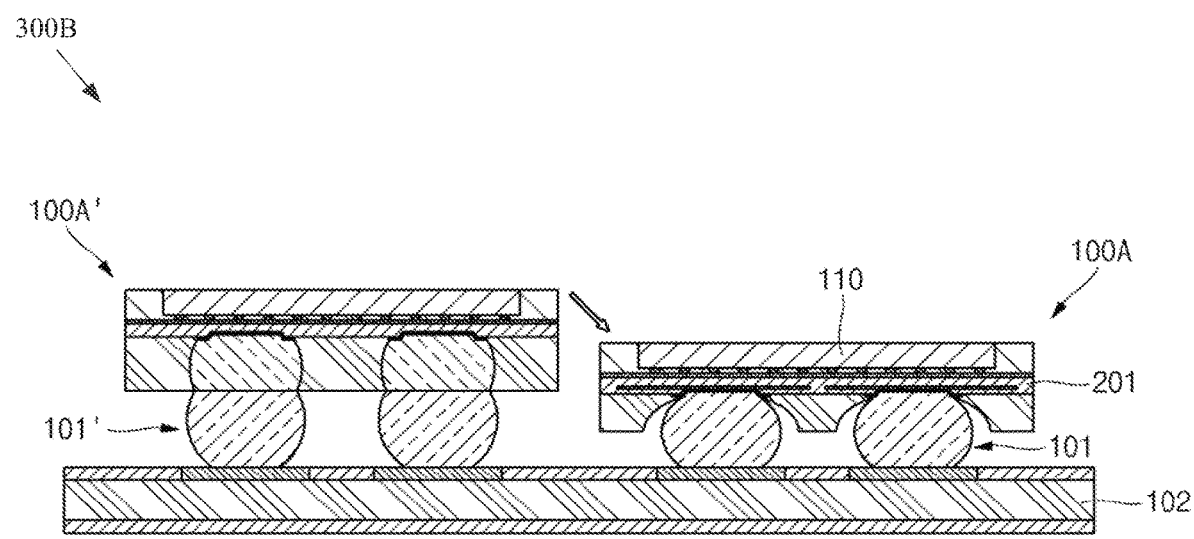

As explained in the discussion of FIGS. 1 and 2, the example methods and structures discussed provide for a reduced vertical profile for attachment of an electronic device to another electronic device (e.g., substrate, circuit board, semiconductor device, etc.). For example, a multi-structure connection (e.g., a multi-ball structure, also called a snowman structure, etc.) is not necessary. FIGS. 3A and 3B provide example illustrations showing various benefits that an electronic device in accordance with various aspects of this disclosure may provide.

For example, as illustrated in FIGS. 3A and 3B, heights or thicknesses of the semiconductor devices 100' and 100A', each utilizing a multi-ball (or snowman) solder joint 101' for attachment to the circuit board 102, are greater than those of semiconductor devices 100 and 100A each utilizing a single spherical (or ellipsoid-shaped) solder joint structure 101, for attachment to the circuit board 102. For example, the semiconductor devices 100 and 100A may have relatively small heights or thicknesses.

The semiconductor device 100 illustrated in FIG. 3A may, for example, be the same as the semiconductor device 100 of FIG. 2E, and the semiconductor device 100A illustrated in FIG. 3B, and may be similar to the semiconductor device 100 and comprise a circuit board 201 (e.g., a packaging substrate, interposer, coreless signal distribution structure, etc.) intervening between the semiconductor die 110 and a spherical (or ellipsoid-shaped) conductive ball 101.

As discussed herein, the electronic component may comprise a substrate (e.g., a printed circuit board, a motherboard, a packaging substrate, an interposer, a coreless substrate or signal distribution structure, etc.). An example substrate implementation will now be provided.

Figure 4:
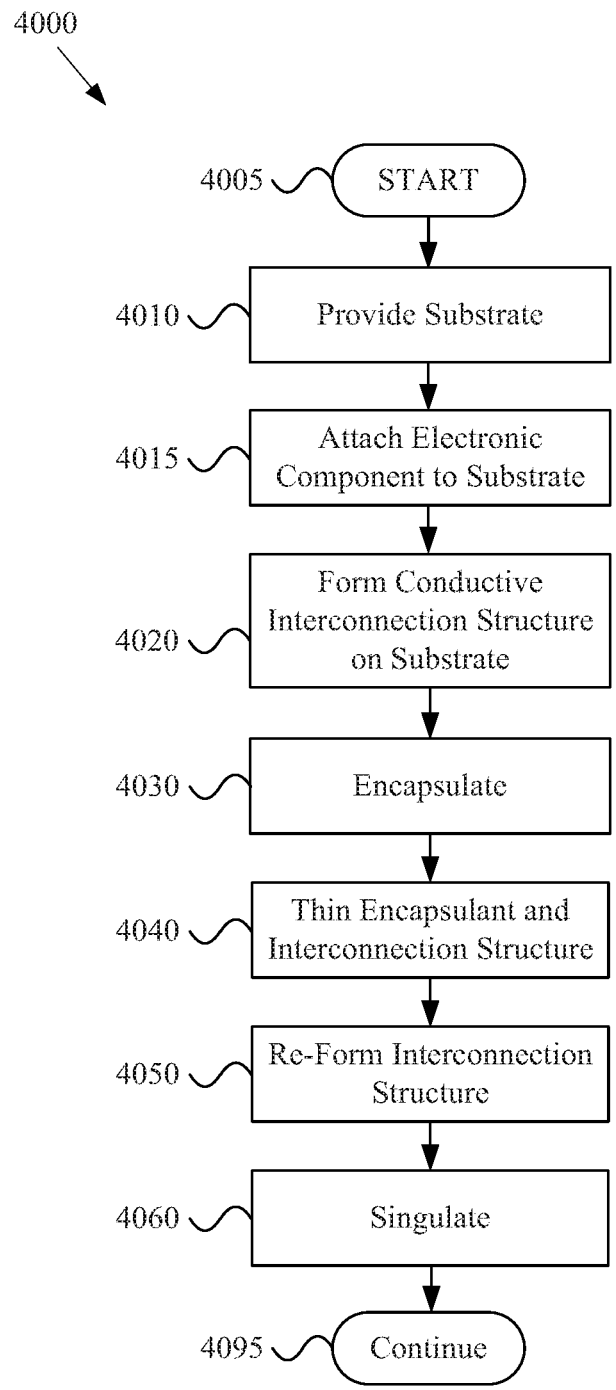
FIG. 4 shows a flow diagram of an example method of making an electronic device, in accordance with various aspects of the present disclosure.

FIG. 4 shows a flow diagram of an example method 4000 of making an electronic device, in accordance with various aspects of the present disclosure. The example method 4000 may, for example, share any or all characteristics with any other method discussed herein (e.g., the example method 1000 of FIG. 1, the example method 6000 of FIG. 6, etc.). FIGS. 5A-5F show cross-sectional views illustrating example electronic devices and example methods of making an electronic device, in accordance with various aspects of the present disclosure. The structures shown in 5A-5F may share any or all characteristics with analogous structures shown in FIGS. 2A-2E, FIGS. 3A-3B, FIGS. 7A-7G, etc. FIGS. 5A-5F may, for example, illustrate an example electronic device at various stages (or blocks) of the example method 4000 of FIG. 4. FIGS. 4 and 5A-5F will now be discussed together. It should be noted that the order of the example blocks of the example method 4000 may vary without departing from the scope of this disclosure.

The example method 4000 may, at block 4010, comprise providing a substrate for processing. Block 4010 may comprise providing the substrate in any of a variety of manners, non-limiting examples of which are provided herein. Block 4010 may, for example, share any or all characteristics with block 1010 of the example method 1000 shown in FIG. 1 and discussed herein.

Block 4010 may, for example, comprise receiving the substrate (or plurality, or panel, or wafer thereof) from an upstream manufacturing station or process (e.g., testing, cleaning process, marking or tracking process, etc.), receiving the substrate from an offsite location (e.g., an offsite substrate production facility, warehouse, etc.), etc. Block 4010 may then, for example, comprise providing such received substrate for further processing. Also for example, block 4010 may comprise forming any or all of the various aspects of the substrate.

The substrate may comprise any of a variety of characteristics, non-limiting examples of which are provided herein. For example, the substrate may comprise circuit board or circuit board material (e.g., FR-4 glass epoxy, G-10 woven glass and epoxy, FR-n with n=1 to 6, CEM-m with m=1 to 4, laminate, laminate thermoset resin, copper-clad laminate, resin impregnated B-state cloth (pre-preg), polytetrafluoroethylene, combinations thereof, equivalents thereof, etc.). The substrate may also, for example, be coreless. The substrate may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The substrate may, for example, comprise silicon or any of a variety of semiconductor materials. The substrate may also, for example, comprise a glass or metal plate (or wafer). The substrate may have any of a variety of configurations. For example, the substrate may be in a wafer or panel form. The substrate may also, for example, be in a diced or singulated form. The substrate may also be referred to herein as an interposer, signal distribution structure, etc.

The substrate may, for example, comprise a bulk material portion with no conductive routing paths. Alternatively for example, the substrate may comprise one or more conductive layers, vias, and or signal distribution structures. For example, the substrate may comprise conductive vias extending into the substrate from the top surface thereof to or toward the bottom surface thereof.

The substrate may, for example, comprise one or more embedded functional electronic components (e.g., active components, passive components, etc.), signal routing structures, component attachment structures, etc. The substrate may, for example, comprise a functional electronic device being utilized as a substrate for another component (e.g., in a 3D stacking configuration). The substrate may also, for example, be free of any functional electronic components (e.g., comprising only one or more dielectric layers, one or more conductive layers, providing signal routing traces and pads for the attachment of electrical components thereto, etc.).

The substrate provided at block 4010 may, for example, comprise a circuit pattern (e.g., a conductive pad, bond pad, land, trace, etc.) on the one or more substrate dielectric layers. The circuit pattern (e.g., comprising one or more conductive layers) may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. The circuit pattern may, for example, be utilized for inputting and/or outputting electrical signals to and/or from the substrate (or other component), for routing electrical signals, etc.

In an example implementation in which block 4010 comprises forming the circuit pattern, the circuit pattern (or conductive layer thereof) may be formed or deposited utilizing any one or more of a variety of processes (e.g., electrolytic plating, electroless plating, chemical vapor deposition (CVD), sputtering or physical vapor deposition (PVD), plasma vapor deposition, printing, lithography, etc.), but the scope of the present disclosure is not limited thereto.

A first dielectric layer may be on the substrate. For example, the first dielectric layer may be on (e.g., directly or indirectly on) the substrate dielectric layer(s) and/or on at least a portion of the circuit pattern. The first dielectric layer may also, for example, comprise a first aperture (or opening) through which a portion of the circuit pattern is exposed.

In an example implementation, the entire substrate dielectric layer (e.g., a top surface or side thereof) may be covered by the first dielectric layer (e.g., completely or partially covered), most of the circuit pattern may be covered by the first dielectric layer, and an exposed region of the circuit pattern (e.g., corresponding to a conductive pad, ball pad, land, trace, etc.) may be exposed through the first aperture in the first dielectric layer.

The first dielectric layer may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The first dielectric layer may, for example, be or comprise the same dielectric material as the substrate dielectric layer(s). The first dielectric layer may also, for example, comprise a dielectric material that is different from the dielectric material(s) of the substrate dielectric layer(s).

In an example implementation in which block 4010 comprises forming the first dielectric layer, block 4010 may comprise forming the first dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. As discussed herein, block 4010 (or generally any or all of the processes discussed herein) may be performed at the semiconductor wafer level or panel level, or at the individual substrate level.

Note that the forming of the circuit pattern (or conductive layer) and/or first dielectric layer may be repeated any number of times, for example to create a multi-layered structure (e.g., a multi-layered signal distribution structure, etc.) comprising a plurality of conductive layers and/or a plurality of dielectric layers.

In an example implementation, an under bump metallization (UBM) may be on the circuit pattern (or conductive layer) exposed through the first aperture in the first dielectric layer. The UBM may also, for example, be on a portion (e.g., an interior surface) of the first dielectric layer that defines the first aperture. The UBM may additionally, for example, be on a top surface of the first dielectric layer around the periphery of the first aperture.

In an example implementation, the UBM, which may also be referred to as a UBM structure, may for example comprise a layer of titanium-tungsten (TiW), which may be referred to as a layer or seed layer. Such layer may, for example, be formed by sputtering. Also for example, the UBM structure may comprise a layer of copper (Cu) on the layer of TiW. Such layer may also, for example, be formed by sputtering. In another example implementation forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure and/or processes utilized to form the UBM structure are not limited to the examples given. For example, the UBM structure may comprise a multilayered structure of chrome/chrome-copper alloy/copper (Cr/Cr—Cu/Cu), titanium-tungsten alloy/copper (Ti—W/Cu), aluminum/nickel/copper (Al/Ni/Cu), equivalents thereof, etc. The UBM structure may also, for example, comprise aluminum, palladium, gold, silver, alloys thereof, etc.

Figure 5A:
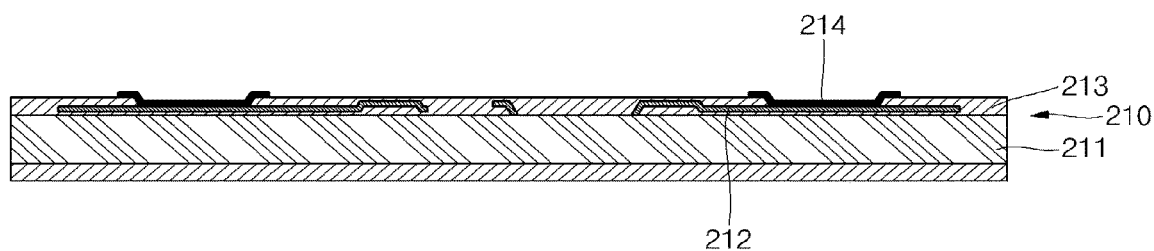
FIGS. 5A-5F show cross-sectional views illustrating example electronic devices and example methods of making an electronic device, in accordance with various aspects of the present disclosure.

An example implementation 500A showing various aspects of block 4010 is shown at FIG. 5A. The example implementation 500A (or assembly, sub-assembly, package, etc.) comprises a substrate 210 having a first side or surface (e.g., a top side, active side, etc.) and a second side or surface (e.g., a bottom side, inactive side, etc.). The first and/or second sides may, for example, be planar. The example implementation 500A comprises a circuit pattern 212 on a substrate dielectric layer 211.

The example implementation 500A further comprises a first dielectric layer 213 on (e.g., directly on, etc.) the substrate dielectric layer 211 and on (e.g., directly on, etc.) a substantial portion or most of the circuit pattern 212. The first dielectric layer 213 comprises a first aperture (or opening) through which an exposed region of the circuit pattern 212 (e.g., corresponding to a conductive pad, ball pad, land, trace, etc.) is exposed. The first dielectric layer 213 may also be referred to as a protection layer, passivation layer, etc.

The example implementation 500A also comprises a UBM structure 214 on the exposed region of the circuit pattern 212. The example UBM structure 214 is also on side surfaces of the first dielectric layer 213 bounding (or defining) the first aperture and on a portion of the top surface of the first dielectric layer 213 around the periphery of the first aperture.

Though the examples presented herein mainly concern a single substrate, the scope of this disclosure is not limited to a single substrate (or electronic device). For example, the substrate may (e.g., throughout any or all of the process blocks discussed herein) be in a wafer or panel form. Such a wafer or panel may comprise same substrates or different substrates.

Additionally, though the examples presented herein mainly focus on a single connection or terminal of a substrate, the scope of the present disclosure is not limited thereto. For example, the aspects discussed herein readily extend to any number of connections or terminals of a substrate (or a plurality thereof).

In general, block 4010 comprises providing a substrate for processing. Accordingly, the scope of this disclosure should not be limited by characteristics of any particular type of substrate or by any particular manner of providing a substrate.

The example method 4000 may, at block 4015, comprise attaching an electronic component to the substrate. Block 4015 may comprise attaching the electronic component to the substrate in any of a variety of manners, non-limiting examples of which are provided herein.

For example, block 4015 may comprise attaching (or coupling) an electronic component by soldering, adhering utilizing adhesive, utilizing flip-chip attachment technology, utilizing wire-bonding technology, etc. In an example implementation, block 415 may comprise attaching conductive bumps on an active side (or front side) of a semiconductor die to the substrate. In another example implementation, block 4015 may comprise attaching conductive bumps on an inactive side (or back side) of a semiconductor die (e.g., formed utilizing through silicon via (TSV) technology) to the substrate. In an additional example implementation, block 4015 may comprise adhering a back side of a semiconductor die to the top side of the substrate, and wire-bonding bond pads on the top (or active) side of the semiconductor die to the circuit pattern of the substrate.

Note that block 4015 may comprise attaching any number and/or any type of electronic component to the substrate. For example, block 4015 may comprise attaching one or more semiconductor die, one or more passive components, etc., to the substrate.

Figure 5B:
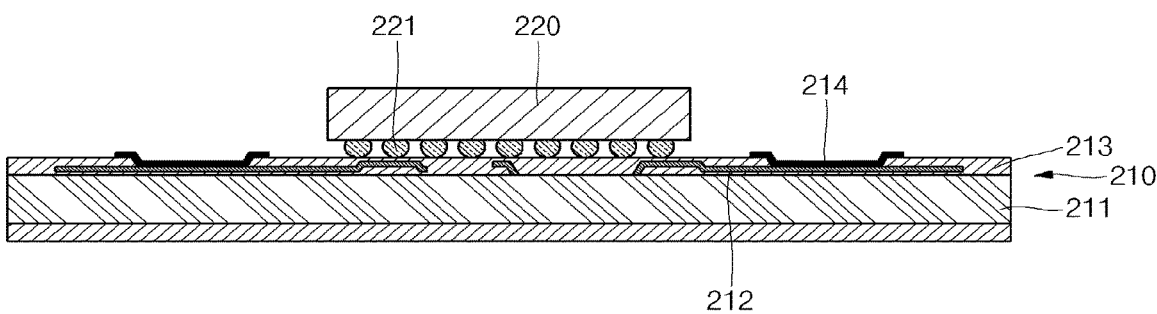

An example implementation 500B showing various aspects of block 4015 is shown at FIG. 5B. The example implementation 500B (or assembly, sub-assembly, package, etc.) comprises a semiconductor die 220 having a conductive bumps 221 (e.g., flip-chip bumps, C4 bumps, etc.) on a lower side thereof attached to circuit patterns on a top side of the substrate 210. Though not shown, an underfill material (e.g., capillary underfill, pre-applied underfill, etc.) may be formed between the semiconductor die 220 and the substrate 210.

In general, block 4015 may comprise attaching an electronic component to the substrate. Accordingly, the scope of this disclosure should not be limited by characteristics of any particular type of component or number of components, or any particular manner of attaching a component to a substrate.

The example method 4000 may, at block 4020, comprise forming a conductive interconnection structure. Block 4020 may comprise forming (and/or coupling) a conductive interconnection structure (e.g., on a circuit pattern and/or UBM on the substrate) in any of a variety of manners, non-limiting examples of which are provided herein. Block 4020 may, for example, share any or all characteristics with block 1020 of the example method 1000 of FIG. 1 and discussed herein.

Figure 5C:
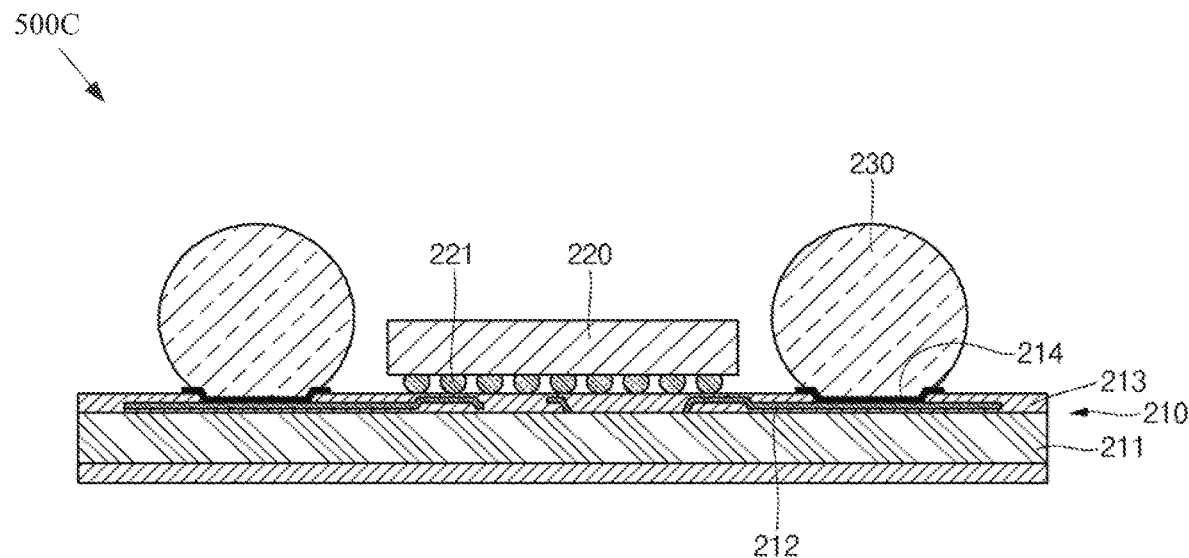

An example implementation 500C (or assembly, subassembly, package, etc.) of block 4020 is shown at FIG. 5C. The example implementation 500C shows an example conductive interconnection structure 230 on the UBM 214. The example conductive interconnection structure 230 is a conductive ball (e.g., a solder ball), but the scope of the present disclosure is not limited thereto. The conductive interconnection structure 230 is taller than the semiconductor die 220. For example, the top of the interconnection structure 230 is higher from the substrate 210 than the top side of the semiconductor die 220. As discussed herein, any number of such conductive interconnection structures may be formed (e.g., on the substrate, on a substrate panel, on a substrate wafer, etc.).

In general, block 4020 may comprise forming a conductive interconnection structure. Accordingly, the scope of various aspects of this disclosure should not be limited by characteristics of any particular interconnection structure or by any particular manner of forming or coupling an interconnection structure.

The example method 4000 may, at block 4030, comprise encapsulating the substrate. Block 4030 may, for example, comprise performing such encapsulating in any of a variety of manners, non-limiting examples of which are provided herein. Block 4030 may, for example, share any or all characteristics with block 1030 of the example method 1000 of FIG. 1 and discussed herein.

Block 4030 may, for example, comprise forming encapsulating material to cover at least a top surface (or side) of the substrate, to cover the top surface of the electronic component attached at block 415, and/or to cover a circuit pattern on the substrate (e.g., a portion of the substrate not already covered by other components). The encapsulating material may also, for example, cover at least lateral surfaces of the conductive interconnection structures (e.g., formed at block 4020). The encapsulating material may also, for example, directly contact such covered surfaces, but there may also be one or more intervening layers of material. In an example scenario in which the substrate is in wafer form or panel form, block 4030 may comprise covering the top side of the wafer or panel (e.g., all or at least portions of the wafer or panel to be formed into electronic devices, etc.) with the encapsulating material.

In an example implementation, block 4030 may comprise compressing or flattening the conductive interconnection structure formed at block 4020 during the encapsulating process. For example, block 4030 may comprise utilizing a mold chase to apply a compressive (or clamping) force to the conductive interconnection structure to compress the interconnection structure. In an example scenario in which the conductive interconnection structure comprises solder, the compressive force may be high enough to compress solder. For example, in an example implementation in which the interconnection structure is generally spherical in shape, block 4030 may comprise compressing the interconnection structure into a compressed spherical shape, which may also be referred to as an oblate ellipsoid. For example, block 4030 may comprise compressing the interconnection structure to less than 90% of its original height, less than 80% of its original height, less than 75% of its original height, etc. Note that heat may also be applied during the compression process to soften the interconnection structure or make it more compliant, for example reducing the amount of compressive force needed to perform the compression.

For example, the oblate ellipsoid may comprise a first semi-principal axis (e.g., a vertical axis) and a second semi-principal axis (e.g., a horizontal axis parallel to the top side of the electronic component, etc.) that is at least 10% longer, at least 20% longer, or at least 25% longer than the first semi-principal axis. The oblate ellipsoid may, for example, comprise an ellipsoid width and an ellipsoid height that is at least 10% less, at least 20% less, or at least 25% less than the ellipsoid width. The oblate ellipsoid may, for example comprise a first portion (e.g., near the lateral extremities, etc.) that has a radius of curvature that is less than a radius of curvature of the conductive interconnection structure prior to compression (e.g., in a cross-sectional view in a vertical plane), and a second portion (e.g., near the vertical extremities, etc.) that has a radius of curvature that is greater than the radius of curvature of the conductive interconnection structure prior to compression (e.g., in a cross-sectional view cut in a vertical plane). Note that the bottom side and/or top side of the oblate ellipsoid may be generally flattened at this point (e.g., flattened at the bottom side by the UBM and/or first dielectric layer, flattened at the top side by the mold chase or other compression mechanism, etc.). Thus, in various example implementations, the top and/or bottom side of the interconnection structure may have a flat portion.

The encapsulating material may comprise any of a variety of encapsulating or molding materials (e.g., resin, polymer, polymer composite material, polymer with filler, epoxy resin with filler, epoxy acrylate with filler, combinations thereof, equivalents thereof, etc.). Block 4030 may comprise performing the encapsulating in any of a variety of manners (e.g., transfer molding, compression molding, liquid encapsulant molding, vacuum lamination, paste printing, film assisted molding, etc.). Block 4030 may, for example, comprise injecting and/or compressing the encapsulating material while the conductive interconnection structure is being compressed (e.g., by the mold chase).

Note that the interconnection structure may be compressed prior to the molding process (e.g., by a compression mechanism independent of a mold chase), for example in a manner that causes the compressed interconnection structure to remain in a compressed state once the compression pressure is released (e.g., compressed past the point at which inherent elasticity will return the interconnection structure to its original shape prior to application of the compression force). Note that such compressing may also be performed at high temperatures (e.g., approaching or exceeding reflow temperatures).

In various example implementations presented herein, the encapsulating material may have a top surface that is coplanar with the top surfaces of the interconnection structure. Such an example configuration may be formed during the encapsulating or after the encapsulating. For example, in an example implementation, block 4030 may refrain from forming encapsulating material on the compressed interconnection structure top surface, which may for example be covered by a mold chase, film in a film-assisted molding process, etc. In another example configuration, block 4030 may comprise forming the encapsulating material over the top surface of the compressed interconnection structure, and then comprises performing a thinning process (e.g., grinding, chemical-mechanical planarization or polishing (CMP), etching, etc.) to planarize the top surface of the encapsulating material and/or the compressed interconnection structure surface.

Figure 5D:
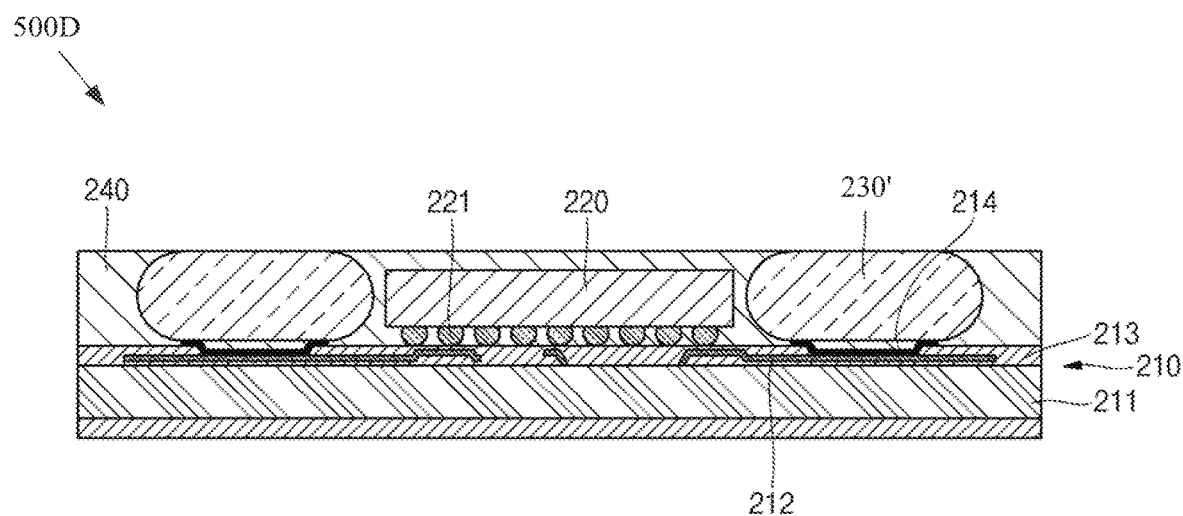

An example implementation 500D showing various aspects of block 4030 is shown at FIG. 5D. The example implementation 500D (or assembly, sub-assembly, package, etc.) comprises an encapsulating material 240. The encapsulating material 240 is shown encapsulating or covering lateral side surfaces of the compressed interconnection structure 230', and a top surface of the first dielectric layer 213. The encapsulating material 240 is also shown encapsulating or covering lateral side surfaces of the semiconductor die 220 and the top surface of the semiconductor die 220. The encapsulating material 240 is further shown underfilling between the semiconductor die 220 and the substrate 210 (e.g., as a molded underfill, etc.). Note, however, that the underfill may be separate from the encapsulating material 240 (e.g., capillary underfill, pre-applied underfill, etc.).

In general, block 4030 may comprise encapsulating the substrate, components attached thereto, conductive interconnections formed thereon, etc. Accordingly, the scope of this disclosure should not be limited by characteristics of any particular amount of encapsulating, particular encapsulating material, and/or particular manner of performing the encapsulating.

The example method 4000 may, at block 4040, comprise thinning the assembly. For example, block 4040 may comprise thinning the encapsulating material formed at block 4030, the interconnection structure formed at block 4030, the electronic component attached to the substrate at block 4015, etc. Block 4040 may comprise performing the thinning in any of a variety of manners, non-limiting examples of which are provided herein. Block 4040 may, for example, share any or all characteristics with block 1040 of the example method of 1000 of FIG. 1 and discussed herein.

Block 4040 may, for example, comprise performing the thinning by grinding, chemical-mechanical planarization or polishing (CMP), etching, combinations thereof, equivalents thereof, other material removal techniques, etc. Such thinning may, for example, planarize the top surface of the assembly (e.g., the top surface of the encapsulating material, the top surface of the conductive interconnection structure, the top surface of the semiconductor die or other electronic component(s) attached to the substrate, etc.).

Block 4040 may, for example, comprise thinning the assembly to remove at least one fourth of the volume of the interconnection structure or at least one half the volume of the interconnection structure. In an example implementation, block 4040 may comprise removing from one fourth to one half, or one fourth to three fourths, of the volume of the interconnection structure. Note that techniques other than thinning may be utilized to remove material from the interconnection structure.

Figure 5E:
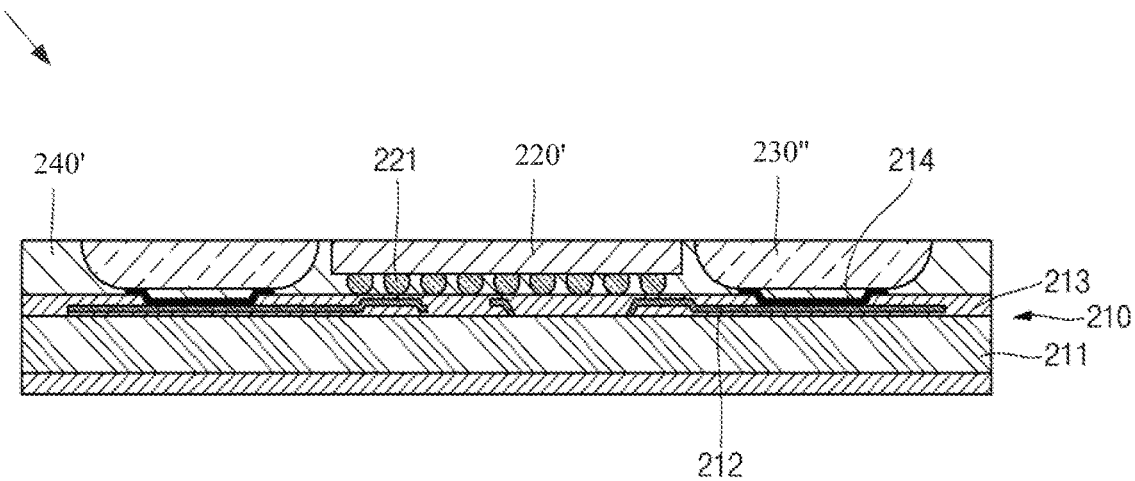

An example implementation 500E showing various aspects of block 4040 is shown at FIG. 5E. Relative to the example implementation 500D of FIG. 5D, the example implementation 500E (or assembly, sub-assembly, package, etc.) comprises a thinned encapsulating material 240', thinned compressed conductive interconnection structure 230", and thinned semiconductor die 220'. For example, a substantial portion of the volume of the encapsulating material 240, of the compressed interconnection structure 230', and of the semiconductor die 220, has been removed. Note that in another implementation, the top side of the semiconductor die 220 might not be thinned and may remain covered by the encapsulating material.

In general, block 4040 may comprise thinning the assembly. Accordingly, the scope of this disclosure should not be limited by characteristics of any particular amount of thinning and/or particular manner of performing the thinning.

The example method 4000 may, at block 4050, comprise re-forming the interconnection structure. Block 4050 may comprise re-forming the interconnection structure in any of a variety of manners, non-limiting examples of which are provided herein. Block 4050 may, for example, share any or all characteristics with block 1050 of the example method 1000 of FIG. 1 and discussed herein.

Block 4050 may, for example, comprise re-forming the interconnection structure formed at block 4020, compressed at block 4030, and thinned at block 4040. In an example implementation in which the interconnection structure comprises solder (e.g., a solder ball or bump, a solder-capped metal post or pillar, etc.), block 4050 may comprise reflowing the solder. For example, in an example implementation in which the interconnection structure formed at block 4020 was a solder ball or bump that was compressed at block 4030 and thinned at block 4040, block 4050 may comprise reflowing the solder ball or bump. Such reflowing may, for example, be performed by placing the assembly in a reflow oven at a temperature in a range of about 150° C. to about 250°. In such an example scenario, surface tension may cause the reflowed thinned solder ball or bump to reform into the general shape of a sphere. Since at block 4040, the example solder ball or bump loses volume, after the reforming of the solder ball at block 4050, the reformed solder ball has a smaller spherical size (or volume) than the solder ball originally formed at block 4020. Note that as with the original solder ball formed at block 4020, the re-formed (or re-balled) solder ball may generally be spherical (e.g., with a flattened bottom at the UBM or conductive pad/layer interface), but may be slightly flattened. For example, the spherical radius of the re-formed solder ball might vary by less than 5% or by less than 10%.

Additionally, since before the re-forming, the top of the thinned conductive interconnection structure was flat and coplanar with the top surface of the encapsulating material (and/or of the electronic component), after the re-forming of the conductive interconnection structure into a generally spherical shape, the top of the re-formed interconnection structure is higher than the top surface of the encapsulating material (and/or the top surface of the electronic component). Thus, the conductive interconnection structure extends (or protrudes) from the top surface of the encapsulating material.

Further, before the re-forming, an occupied volume or space of the encapsulating material was entirely filled by the compressed and thinned interconnection structure. For example, the occupied volume of the encapsulating material was the same as the volume of the compressed and thinned interconnection structure. Thus, after the re-forming, for example after the interconnection structure re-forms into a structure that extends above the encapsulating material, a portion of the previously-occupied volume of the encapsulating material is vacant. For example, a gap may exist between an interior (or inner) surface of the encapsulating material bounding (or defining) the aperture and the re-formed interconnection structure. Such a gap may, for example, extend along the entire lateral (or side) surface of the re-formed interconnection structure, but need not. For example, in an example implementation, the bottom of the interior surface (or inner surface) of the encapsulating material bounding the aperture may extend to and directly contact the second dielectric layer without contacting the re-formed interconnection structure (e.g., a portion of the second dielectric layer may extend laterally between the bottom end of the interior surface of the encapsulating material and the re-formed interconnection structure and/or UBM). Note that in other example implementations, the lower end of the interior surface (or inner surface) of the encapsulating material may contact the lower end of the re-formed interconnection structure and/or UBM.

In an example implementation, at least a portion of the interior surface of the encapsulating material bounding the aperture is laterally separated from the re-formed interconnection structure. For example, the gap may extend from a lower (or bottom) end of the aperture to the top (or upper) end of the aperture. In an example implementation, the lateral width of the gap may continually increase between a bottom end of the aperture and a point of maximum width of the aperture (e.g., where the point of maximum width may be at the top surface of the encapsulating material or may be located between the top and bottom surfaces of the encapsulating material). In another example implementation, the lateral width of the gap may first continually increase and then continually decrease between a bottom end of the aperture and a point of maximum width of the aperture (e.g., without a sharp surface discontinuity in the interior surface between the increasing portion and the decreasing portion). In another example implementation, the lateral width of the gap may first continually increase and then continually decrease between a bottom end of the aperture and top end of the aperture (e.g., without a sharp surface discontinuity in the interior surface between the increasing portion and the decreasing portion).

In another example scenario, the occupied volume or space of the encapsulating material is less than 10% or less than 20% different from the volume of the compressed and thinned interconnection structure. For example, during the thinning of block 1040, the encapsulating material and/or the interconnection structure may be thinned to different respective levels, a material other than the interconnection structure may occupy the occupied volume or space of the encapsulating material, etc. For example, the volume of the re-formed interconnection structure may be greater than the volume of the aperture in the encapsulating material (e.g., by less than 10%, by 10% to 20%, etc.), the volume of the re-formed interconnection structure may be less than the volume of the aperture in the encapsulating material (e.g., by less than 10%, by 10% to 20%, etc.), etc.

Figure 5F:
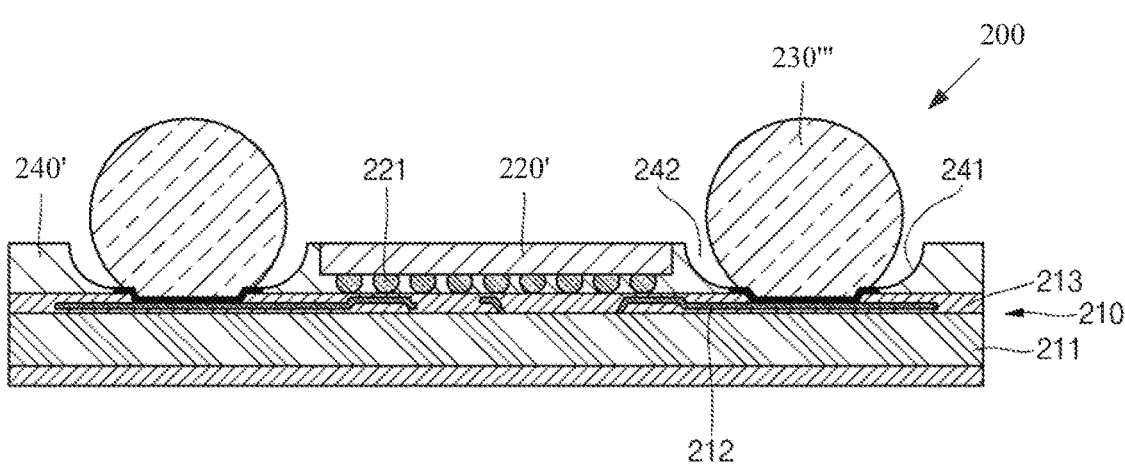

An example implementation 500F showing various aspects of block 4050 is shown at FIG. 5F. Relative to the example implementation 500C of FIG. 5C, the example implementation 500F (or assembly, sub-assembly, package, etc.) comprises a re-formed (compressed and thinned) interconnection structure 230''' that has a substantially lower volume than the original interconnection structure 230 formed at block 4020. Note that the volume of the interconnection structure 230''' may be from one fourth to three fourths of the volume of the interconnection structure 230 formed at block 4020.

The example implementation 500F shows an interior surface 241 (or inner surface) of the encapsulating material 240 defining the aperture through the encapsulating material. The example implementation 500F also shows the gap 242 between the re-formed interconnection structure 230''' and the thinned encapsulating material 240'. Viewed from above (e.g., on a horizontal planar cross-section), the gap 242 may be seen as a circular region between an inner ring corresponding to an outer lateral surface of the re-formed interconnection structure 230''', and an outer ring corresponding to the interior surface 241 of the thinned encapsulating material 240'.

In general, block 4050 may comprise re-forming the interconnection structure. Accordingly, the scope of this disclosure should not be limited by characteristics of any particular amount of reforming and/or particular manner of performing the re-forming.

The example method 4000 may, at block 4060, comprise singulating (or excising) the electronic device from a wafer or panel of such devices. Note that block 4060 may be skipped in an example implementation in which the electronic devices are formed independently, rather than on a wafer or panel. Block 4060 may comprise performing such singulating in any of a variety of manners, non-limiting examples of which are provided herein. Block 4060 may, for example, share any or all characteristics with block 1060 of the example method 1000 of FIG. 1 and discussed herein.

Block 4060 may, for example, comprise performing wafer or panel singulation utilizing any or a variety of mechanical and/or energy-based sawing techniques (e.g., a saw blade, diamond saw, laser or plasma cutting tool, nibbler, etc.).

An example implementation 500F (or assembly, sub-assembly, package, etc.) of block 4060 is shown at FIG. 5F. The example implementation 500F shows the example electronic device 200 singulated from a wafer or panel of such devices. For example, the lateral sides of the example electronic device 200 are generally planar. For example, one or more or all of the lateral sides of the substrate 210, the substrate dielectric layer(s) 211, the first dielectric layer 213, the circuit pattern 212, and/or the encapsulating material 240 may be coplanar and may be exposed to the outside of the electronic device 200.

In general, block 4060 may comprise singulating (or excising) the substrate from a wafer or panel of such substrates. Accordingly, the scope of various aspects of this disclosure should not be limited by characteristics of any particular manner of performing singulation.

The example method 4000 may, for example at block 4095, comprise performing continued processing. Such continued processing may comprise performing any of a variety of continued processing operations. For example, block 4095 may comprise performing further encapsulating operations, forming signal distribution structures, coupling the electronic device to other electronic devices or components, testing, packaging, shipping, marking, etc. For example, block 4095 may comprise coupling the electronic device to a substrate (e.g., a circuit board, a mother board, a packaging substrate of a multi-device module, another electronic device in a 3D configuration, etc.). For example the re-formed interconnection structure may provide a mechanical and/or electrical connection between the circuit pattern of the substrate and a circuit pattern of another substrate. Such attaching may, for example, be performed utilizing a reflow process, conductive adhesive, etc. Note that, although not shown, an underfill material (e.g., a capillary underfill, pre-applied underfill, molded underfill, etc.) may be formed between the electronic device and the other substrate. Note that in various example implementations, since the re-formed interconnection structure protrudes from the encapsulating material, only a single interconnection structure (e.g., only a single conductive ball or bump, only a single solder ball or bump, etc.) may be needed to make the connection, thus providing for a lower vertical profile than a double-structure (e.g., double-ball, double-bump, etc.) connection.

Block 4095 may also, for example, comprise directing execution flow of the example method 4000 to any other block (or sub-block) of the example method 4000 or any other method discussed herein.

In general, block 4095 may comprise performing continued processing. Accordingly, the scope of various aspects of this disclosure should not be limited by characteristics of any particular manner of performing continued processing.

In various example implementations, the electronic component (e.g., the semiconductor die, the substrate, etc.) may be additionally thinned to further reduce the vertical profile of the electronic device. FIG. 6 and FIGS. 7A-7G provide an example of such component thinning.

Figure 6:
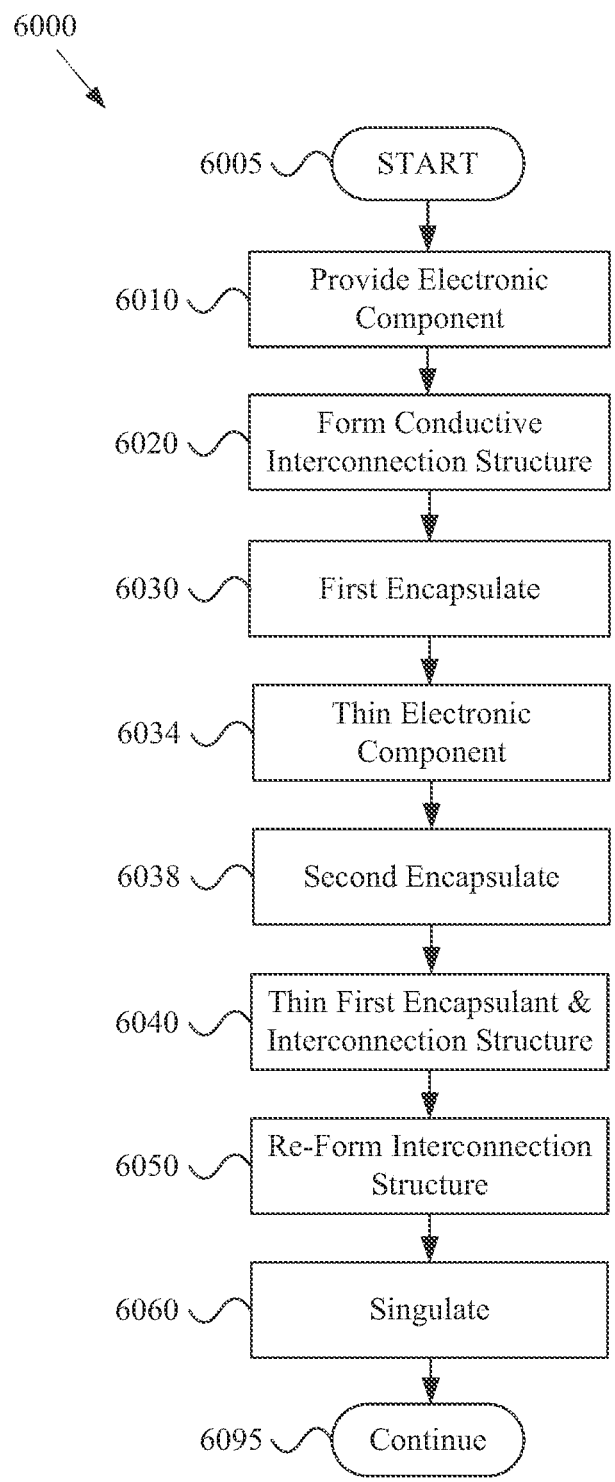
FIG. 6 shows a flow diagram of an example method of making an electronic device, in accordance with various aspects of the present disclosure.

FIG. 6 shows a flow diagram of an example method 6000 of making an electronic device, in accordance with various aspects of the present disclosure. The example method 6000 may, for example, share any or all characteristics with any other method discussed herein (e.g., the example method 1000 of FIG. 1, the example method 4000 of FIG. 4, etc.). FIGS. 7A-7G show cross-sectional views illustrating example electronic devices and example methods of making an electronic device, in accordance with various aspects of the present disclosure. The structures shown in 7A-7G may share any or all characteristics with analogous structures shown in FIGS. 2A-2E, FIGS. 3A-3B, FIGS. 5A-5F, etc. FIGS. 7A-7G may, for example, illustrate an example electronic device at various stages (or blocks) of the example method 6000 of FIG. 6. FIGS. 7 and 7A-7G will now be discussed together. It should be noted that the order of the example blocks of the example method 6000 may vary without departing from the scope of this disclosure.

The example method 6000 may, at block 6010, comprise providing an electronic component for processing. Block 6010 may comprise providing the electronic component in any of a variety of manners, non-limiting examples of which are provided herein. Block 6010 may, for example, share any or all characteristics with block 1010 of the example method 1000 of FIG. 1 and discussed herein.

Figure 7A:
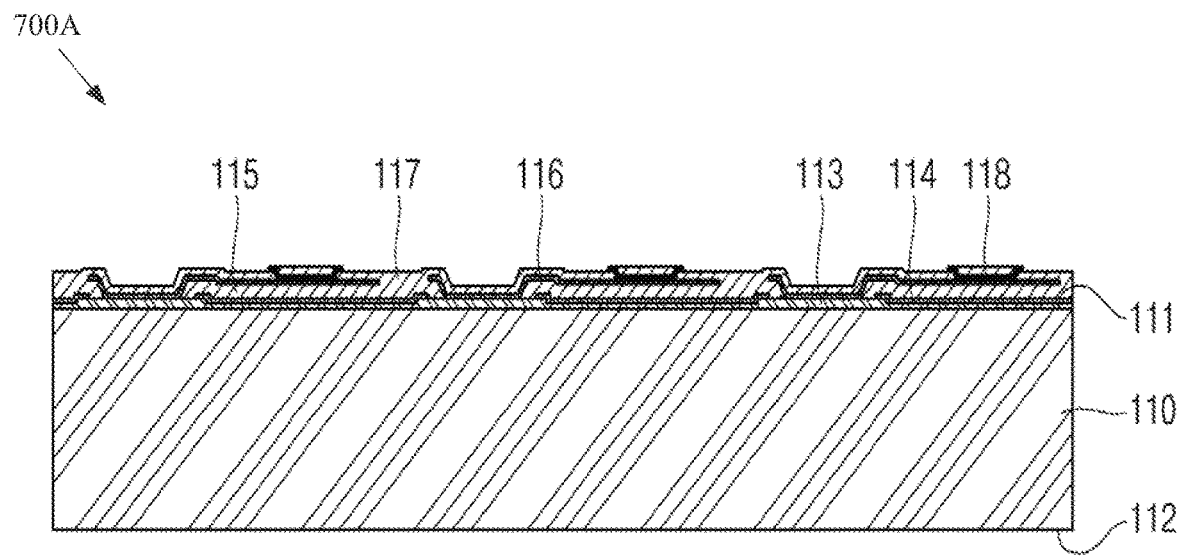
FIGS. 7A-7G show cross-sectional views illustrating example electronic devices and example methods of making an electronic device, in accordance with various aspects of the present disclosure.

An example implementation 700A showing various aspects of block 6010 is shown at FIG. 7A. The example implementation 700A (or assembly, sub-assembly, package, etc.) may, for example, share any or all characteristics with the example implementation 200A of FIG. 2A, discussed herein.

The example method 6000 may, at block 6020, comprise forming a conductive interconnection structure. Block 6020 may comprise forming (and/or coupling) a conductive interconnection structure in any of a variety of manners, non-limiting examples of which are provided herein. Block 6020 may, for example, share any or all characteristics with block 1020 of the example method 1000 of FIG. 1, discussed herein.

Figure 7B:
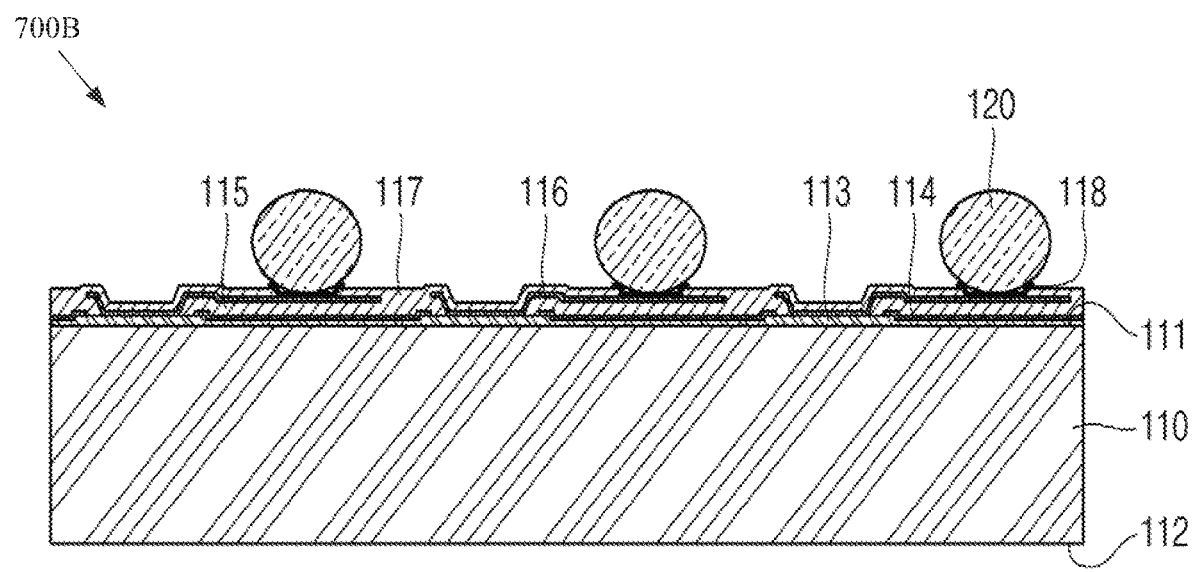

An example implementation 700B showing various aspects of block 6020 is shown at FIG. 7B. The example implementation 700B (or assembly, sub-assembly, package, etc.) may, for example, share any or all characteristics with the example implementation 200B of FIG. 2B, discussed herein.

The example method 6000 may, at block 6030, comprise first encapsulating the electronic component. Block 6030 may comprise forming (and/or coupling) a conductive interconnection structure in any of a variety of manners, non-limiting examples of which are provided herein. Block 6030 may, for example, share any or all characteristics with block 1030 of the example method 1000 of FIG. 1, discussed herein.

Figure 7C:
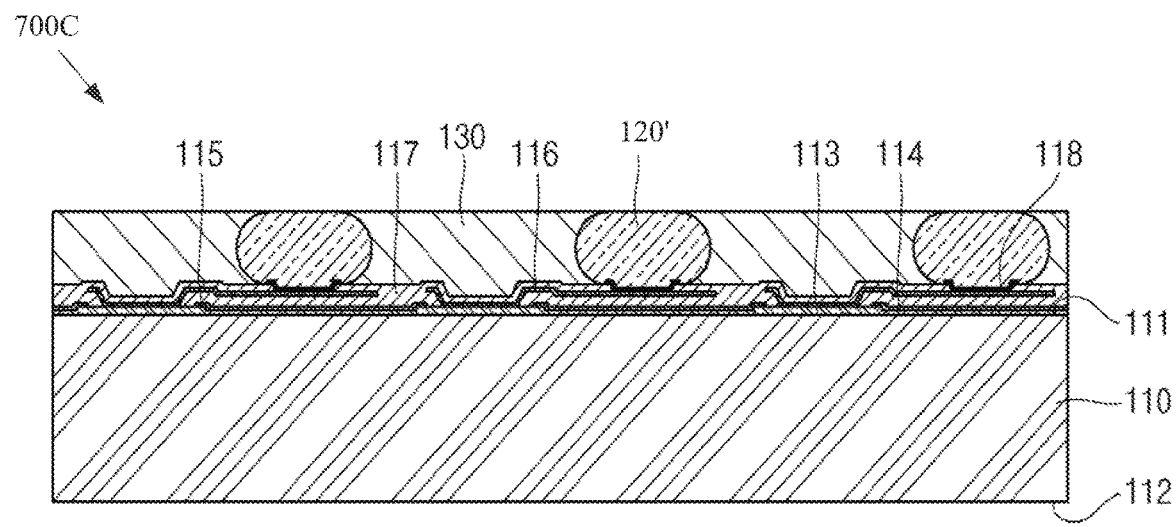

An example implementation 700C showing various aspects of block 6030 is shown at FIG. 7C. The example implementation 700C (or assembly, sub-assembly, package, etc.) may, for example, share any or all characteristics with the example implementation 200C of FIG. 2C, discussed herein.

The example method 6000 may, at block 6034, comprise thinning the electronic component. Block 6034 may comprise thinning the electronic component (e.g., the electronic component provided at block 6010) in any of a variety of manners, non-limiting examples of which are provided herein.

Block 6034 may, for example, comprise performing mechanical and/or chemical thinning of the electronic component. For example, block 6034 may comprise mechanically grinding and/or chemically etching or dissolving a portion of the electronic component. Also for example, block 6034 may comprise utilizing directed energy ablation or cutting to thin the electronic component.

Block 6034 may, for example, comprise back grinding the electronic component. For example, in an example implementation in which the electronic component is a semiconductor die (or interposer, etc.) that comprises bulk silicon, block 6034 may comprise removing a substantial portion (or most or all) of the bulk silicon. The electronic device may, for example, be held (or fixed) from the top side of the first encapsulating material while such thinning is being performed.

Figure 7D:
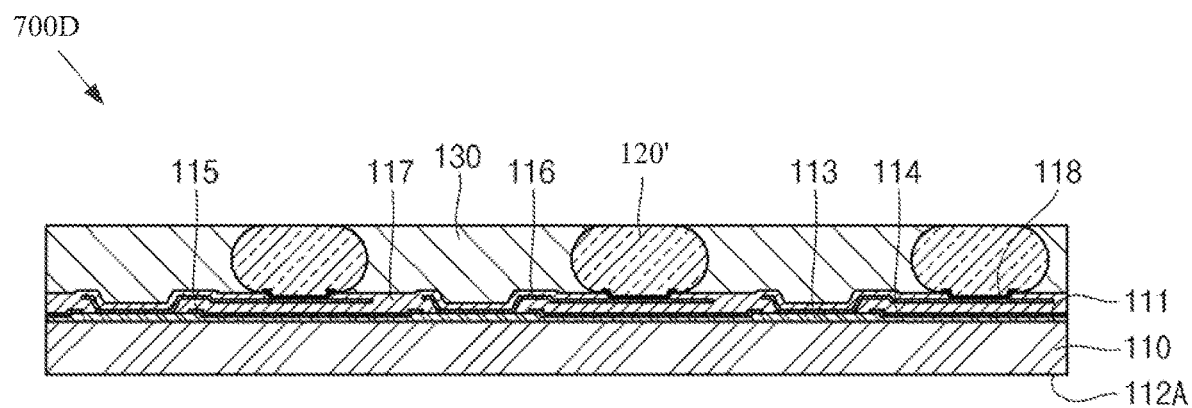

An example implementation 700D showing various aspects of block 6034 is shown at FIG. 7D. The example implementation 700D (or assembly, sub-assembly, package, etc.), relative to the example implementation 700C, shows that the semiconductor die 110 (or other electronic component, substrate, etc.) has been thinned from the bottom side. After such back grinding, the second surface of the semiconductor die 110 is labeled 112A.

In general, block 6034 may comprise thinning the electronic component. Accordingly, the scope of this disclosure should not be limited by characteristics of any particular amount of thinning and/or of any particular manner of performing thinning.

The example method 6000 may, at block 6038, comprise second encapsulating the electronic component. Block 6038 may comprise second encapsulating the electronic component (e.g., a lower or bottom side thereof) in any of a variety of manners, non-limiting examples of which are provided herein. Block 6038 may, for example, share any or all characteristics with block 6030 (e.g., performed on the opposite side of the electronic component).

Figure 7E:
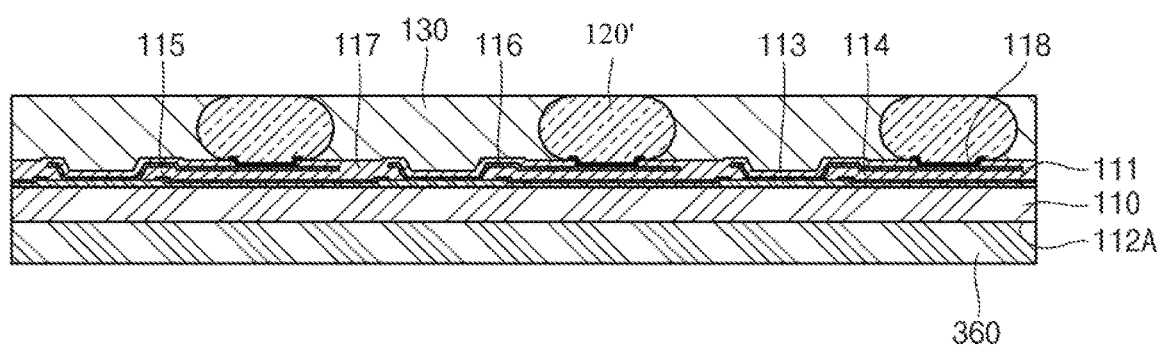

An example implementation 700E showing various aspects of block 6038 is shown at FIG. 7E. The example implementation 700E (or assembly, sub-assembly, package, etc.), relative to the example implementation 700D, shows the second encapsulating material 360 on the lower or bottom side of the semiconductor die 110 (or other electronic component, substrate, etc.).

In general, block 6038 may comprise second encapsulating the electronic component. Accordingly, the scope of this disclosure should not be limited by characteristics of any particular type or amount of encapsulating and/or of any particular manner of encapsulating.

The example method 6000 may, at block 6040, comprise thinning the assembly. Block 6040 may comprise thinning the electronic component in any of a variety of manners, non-limiting examples of which are provided herein. Block 6040 may, for example, share any or all characteristics with block 1040 of the example method 1000 of FIG. 1 and discussed herein.

Figure 7F:
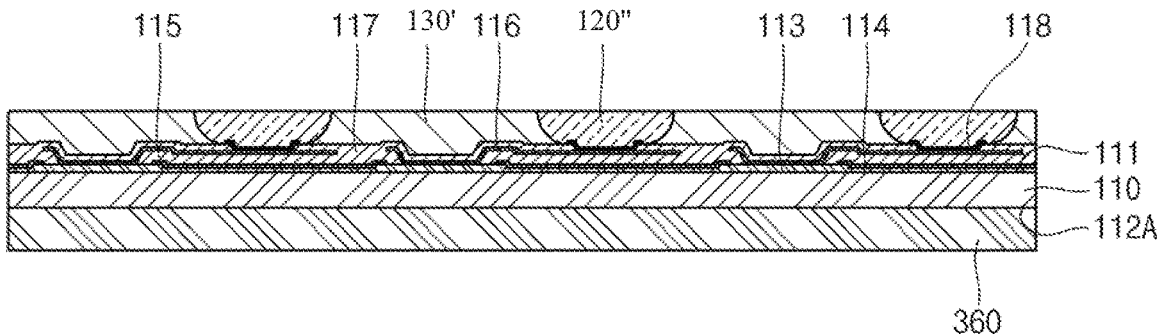

An example implementation 700F showing various aspects of block 6040 is shown at FIG. 7F. The example implementation 700F (or assembly, sub-assembly, package, etc.) may, for example, share any or all characteristics with the example implementation 200D of FIG. 2D, discussed herein. The example implementation 700F, however as explained herein, comprises a thinned semiconductor die 110 and a second encapsulating material 360 on the bottom side of the thinned semiconductor die 110.

The example method 6000 may, at block 6050, comprise re-forming the interconnection structure. Block 6050 may comprise re-forming the interconnection structure in any of a variety of manners, non-limiting examples of which are provided herein. Block 6050 may, for example, share any or all characteristics with block 1050 of the example method 1000 of FIG. 1, discussed herein.

Figure 7G:
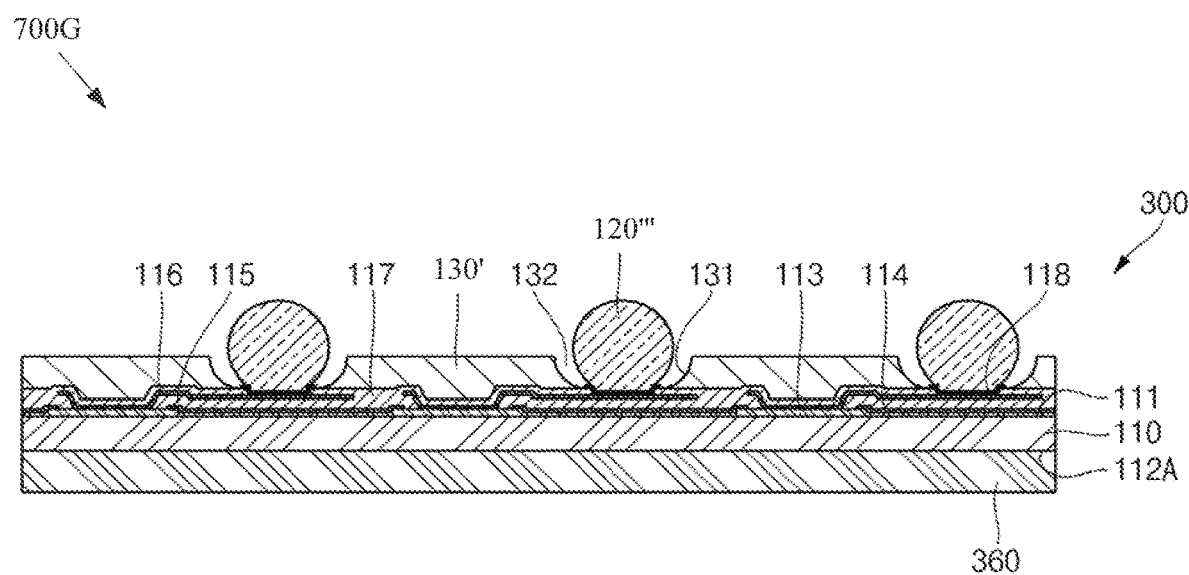

An example implementation 700G showing various aspects of block 6050 is shown at FIG. 7G. The example implementation 700G (or assembly, sub-assembly, package, etc.) may, for example, share any or all characteristics with the example implementation 200E of FIG. 2E, discussed herein.

The example method 6000 may, at block 6060, comprise singulating (or excising) the electronic device from a wafer or panel of such devices. Note that block 6060 may be skipped in an example implementation in which the electronic devices are formed independently, rather than on a wafer or panel. Block 6060 may comprise performing such singulating in any of a variety of manners, non-limiting examples of which are provided herein. Block 6060 may, for example, share any or all characteristics with block 1060 of the example method 1000 of FIG. 1, discussed herein.

An example implementation 700G (or assembly, sub-assembly, package, etc.) showing various aspects of block 6060 is shown at FIG. 7G. The example implementation 700G (or assembly, sub-assembly, package, etc.) may, for example, share any or all characteristics with the example implementation 200E of FIG. 2E, discussed herein. The lateral sides of the example singulated electronic device 300 may, for example, be generally planar. For example, one or more or all of the lateral sides of the semiconductor die 110, the die dielectric layer 114, the first dielectric layer 115, the conductive layer 116, the second dielectric layer 117, the encapsulating material 130, and the second encapsulating material 360 may be coplanar and may be exposed to the outside of the electronic device 300.

As described herein, in an example semiconductor device (or other electronic device) in accordance with various aspects of the present disclosure and a manufacturing method thereof, the semiconductor device may have a reduced thickness. For example, in an example semiconductor device, a single spherical interconnection structure, instead of a multi-sphere (or snowman) joint structure comprising a plurality of spherical interconnection structures, is formed, thereby reducing the thickness of the semiconductor device. In addition, since the example semiconductor device has a spherical joint structure, instead of a multi-sphere (or snowman) joint structure, it is possible to prevent or reduce joint damage due to package warpage stress concentrating on the narrow neck of the multi-sphere (or snowman) join structure.

In addition, in an example semiconductor device (or other electronic device) in accordance with various aspects of the present disclosure and a manufacturing method thereof, an interconnection structure protruding from the electronic device (e.g., a proud ball structure) may be implemented without ablation (e.g., mechanical ablation, laser ablation, etc.) and/or an additional ball drop process. For example, in the example semiconductor device and method, a conductive ball may be encapsulated using an encapsulant, and the conductive ball and the encapsulant may then be grinded to expose and thin the conductive ball, followed by re-balling at a high temperature, thereby forming a protruding ball without ablation of the encapsulating material and/or an additional ball drop process. Such reduction in processing steps also reduces processing time and cost, and reduces the number of opportunities for defects.

The discussion herein included numerous illustrative figures that showed various portions of an electronic assembly and method of manufacturing thereof. For illustrative clarity, such figures did not show all aspects of each example assembly. Any of the example assemblies and/or methods provided herein may share any or all characteristics with any or all other assemblies and/or methods provided herein. For example and without limitation, any of the example assemblies and/or methods shown and discussed with regard to FIGS. 1-3, or portions thereof, may be incorporated into any of the example assemblies and/or methods discussed with regard to FIGS. 4-5 and/or discussed with regard to FIGS. 6-7. Conversely, any of the assemblies and/or methods shown and discussed with regard to FIGS. 4-5 and/or discussed with regard to FIGS. 6-7 may be incorporated into the assemblies and/or methods shown and discussed with regard to FIGS. 1-3. Similarly, any of the assemblies and/or methods shown and discussed with regard to FIGS. 4-5 may be incorporated into the assemblies and/or methods shown and discussed with regard to FIGS. 6-7, and vice versa.

In summary, various aspects of this disclosure provide an electronic device and a method of making an electronic device. As non-limiting examples, various aspects of this disclosure provide various methods of making electronic devices, and electronic devices manufactured thereby, that comprise utilizing a compressed interconnection structure (e.g., a compressed solder ball, etc.) in an encapsulating process to form an aperture in an encapsulant. The compressed interconnection structure may then be reformed in the aperture. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   an electronic component comprising a conductive pad;
   an encapsulating material on the electronic component;
   an aperture through the encapsulating material that extends vertically completely through the encapsulating material to at least the conductive pad, the entire aperture defined by an inner surface of the encapsulating material and shaped like a portion of an oblate ellipsoid, the oblate ellipsoid having a vertical semi-principal axis and a horizontal semi-principal axis longer than the vertical semi-principal axis, wherein the horizontal semi-principal axis is at least 20% longer than the vertical semi-principal axis; and a conductive interconnection structure that extends through the aperture and protrudes from the encapsulating material, is electrically connected to the conductive pad, and is separated from at least a portion of the inner surface of the encapsulating material.

2. The electronic device of claim 1, wherein the volume of the aperture is within 10% of the volume of the conductive interconnection structure.

3. The electronic device of claim 1, wherein the volume of the aperture is the same as the volume of the conductive interconnection structure, the conductive interconnection structure protruding from the aperture.

4. The electronic device of claim 1, wherein a point of maximum width of the aperture is between an upper end of the aperture and a lower end of the aperture.

5. The electronic device of claim 1, wherein a first portion of the aperture has a first radius of curvature that is less than a radius of curvature of the conductive interconnection structure, and a second portion of the aperture has a second radius of curvature that is greater than the radius of curvature of the conductive interconnection structure.

6. The electronic device of claim 1, wherein the entire aperture is shaped like an oblate ellipsoid with a flattened top and a flattened bottom.

7. The electronic device of claim 1, wherein the electronic component comprises a semiconductor die.

8. The electronic device of claim 1, wherein:
the electronic component comprises a substrate;
the conductive pad and conductive interconnection structure are positioned on a first side of the substrate; and
the electronic device comprises a semiconductor die attached to the first side of the substrate.

9. The electronic device of claim 1, wherein the encapsulating material comprises a molding material.

10. The electronic device of claim 1, comprising a lower substrate below the electronic component and a substrate conductive pad on the lower substrate, wherein the conductive interconnection structure is a conductive ball that is connected to the conductive pad and to the substrate conductive pad, and is positioned directly vertically between the electronic component and the substrate.

11. An electronic device comprising:
an electronic component comprising a conductive pad;
an encapsulating material on the electronic component;
an aperture through the encapsulating material that extends vertically completely through the encapsulating material to at least the conductive pad, the entire aperture defined by an inner surface of the encapsulating material and shaped like a portion of an oblate ellipsoid, the oblate ellipsoid having a vertical semi-principal axis and a horizontal semi-principal axis longer than the vertical semi-principal axis; and
a conductive interconnection structure that extends through the aperture and protrudes from the encapsulating material, is electrically connected to the conductive pad, and is separated from at least a portion of the inner surface of the encapsulating material, wherein the conductive interconnection structure does not contact the encapsulating material.

12. An electronic device comprising:
a semiconductor die comprising a conductive contact on an active side of the semiconductor die;
an encapsulating material on the semiconductor die, wherein the encapsulating material has a top surface, and a bottom surface opposite the top surface and that faces the semiconductor die;
an aperture through the encapsulating material that extends vertically completely through the encapsulating material to at least the conductive contact, wherein:
between a lower level that is at least as low as a top surface of the conductive contact and an upper level at the top surface of the encapsulating material, the aperture is defined by an inner surface of the encapsulating material that has a continually changing upward slope with no surface discontinuity; and
the entire aperture is shaped like a portion of a compressed sphere, the compressed sphere having a vertical height and a horizontal width greater than the vertical height; and
a conductive interconnection structure that extends through the aperture and protrudes from the top surface of the encapsulating material, is electrically connected to the conductive contact, and is separated from at least a portion of the inner surface of the encapsulating material, wherein the conductive interconnection structure does not contact the encapsulating material.

13. The electronic device of claim 12, wherein the volume of the aperture is within 10% of the volume of the conductive interconnection structure.

14. The electronic device of claim 12, wherein the volume of the aperture is substantially the same as the volume of the conductive interconnection structure.

15. An electronic device comprising:
a semiconductor die comprising a conductive contact on an active side of the semiconductor die;
an encapsulating material on the semiconductor die, wherein the encapsulating material has a top surface, and a bottom surface opposite the top surface and that faces the semiconductor die;
an aperture through the encapsulating material that extends vertically completely through the encapsulating material to at least the conductive contact, wherein:
between a lower level that is at least as low as a top surface of the conductive contact and an upper level at the top surface of the encapsulating material, the aperture is defined by an inner surface of the encapsulating material that has a continually changing upward slope with no surface discontinuity; and
the entire aperture is shaped like a portion of a compressed sphere, the compressed sphere having a vertical height and a horizontal width greater than the vertical height, wherein the horizontal width is at least 20% greater than the vertical height; and
a conductive interconnection structure that extends through the aperture and protrudes from the top surface of the encapsulating material, is electrically connected to the conductive contact, and is separated from at least a portion of the inner surface of the encapsulating material.

* * * * *